United States Patent
Yu et al.

(10) Patent No.: US 12,557,396 B2
(45) Date of Patent: Feb. 17, 2026

(54) DEVICE HAVING NANOSTRUCTURE ELECTROSTATIC DISCHARGE STRUCTURE AND METHOD

(71) Applicant: Taiwan Semiconductor Manufacturing Company, Ltd., Hsinchu (TW)

(72) Inventors: Hsin-Yuan Yu, Hsinchu (TW); Ming-Shuan Li, Hsinchu (TW); Wun-Jie Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 413 days.

(21) Appl. No.: 18/295,241

(22) Filed: Apr. 3, 2023

(65) Prior Publication Data
US 2024/0332282 A1 Oct. 3, 2024

(51) Int. Cl.
*H10D 89/60* (2025.01)
*H10D 84/01* (2025.01)
*H10D 84/03* (2025.01)

(52) U.S. Cl.
CPC ....... *H10D 89/711* (2025.01); *H10D 84/0109* (2025.01); *H10D 84/038* (2025.01); *H10D 89/611* (2025.01); *H10D 89/921* (2025.01)

(58) Field of Classification Search
None
See application file for complete search history.

(56) References Cited

U.S. PATENT DOCUMENTS

| | | |
|---|---|---|
| 2002/0085329 A1 | 7/2002 | Lee et al. |
| 2010/0155776 A1* | 6/2010 | Lee ............ H10D 84/038 257/355 |
| 2013/0277744 A1* | 10/2013 | Lee ............ H10D 84/83 257/347 |
| 2016/0293739 A1 | 10/2016 | Zhang |
| 2020/0312960 A1* | 10/2020 | Bomberger ....... H01L 21/02532 |
| 2021/0398972 A1 | 12/2021 | Yang et al. |
| 2022/0199610 A1* | 6/2022 | Guha ............ H01L 23/60 |
| 2022/0344352 A1 | 10/2022 | Chu et al. |
| 2023/0361112 A1* | 11/2023 | Hong ............ H10D 88/00 |

FOREIGN PATENT DOCUMENTS

TW 202032795 A 9/2020

* cited by examiner

*Primary Examiner* — Bilkis Jahan
(74) *Attorney, Agent, or Firm* — Seed IP Law Group LLP

(57) ABSTRACT

A device includes a first circuit region including a nanostructure device and a second circuit region offset from the first circuit region. The nanostructure device has a vertical stack of nanostructures disposed in a plurality of first semiconductor layers and a gate structure wrapping around the nanostructures of the vertical stack. The second circuit region includes a bipolar junction device electrically connected to the nanostructure device and at least one diode electrically connected between a collector and a base of the bipolar junction device. At least one implant region extends through the plurality of first semiconductor layers and a plurality of second semiconductor layers that are disposed between respective vertically neighboring pairs of the plurality of first semiconductor layers. A backside interconnect structure is electrically connected to a source/drain region of the nanostructure device.

20 Claims, 28 Drawing Sheets

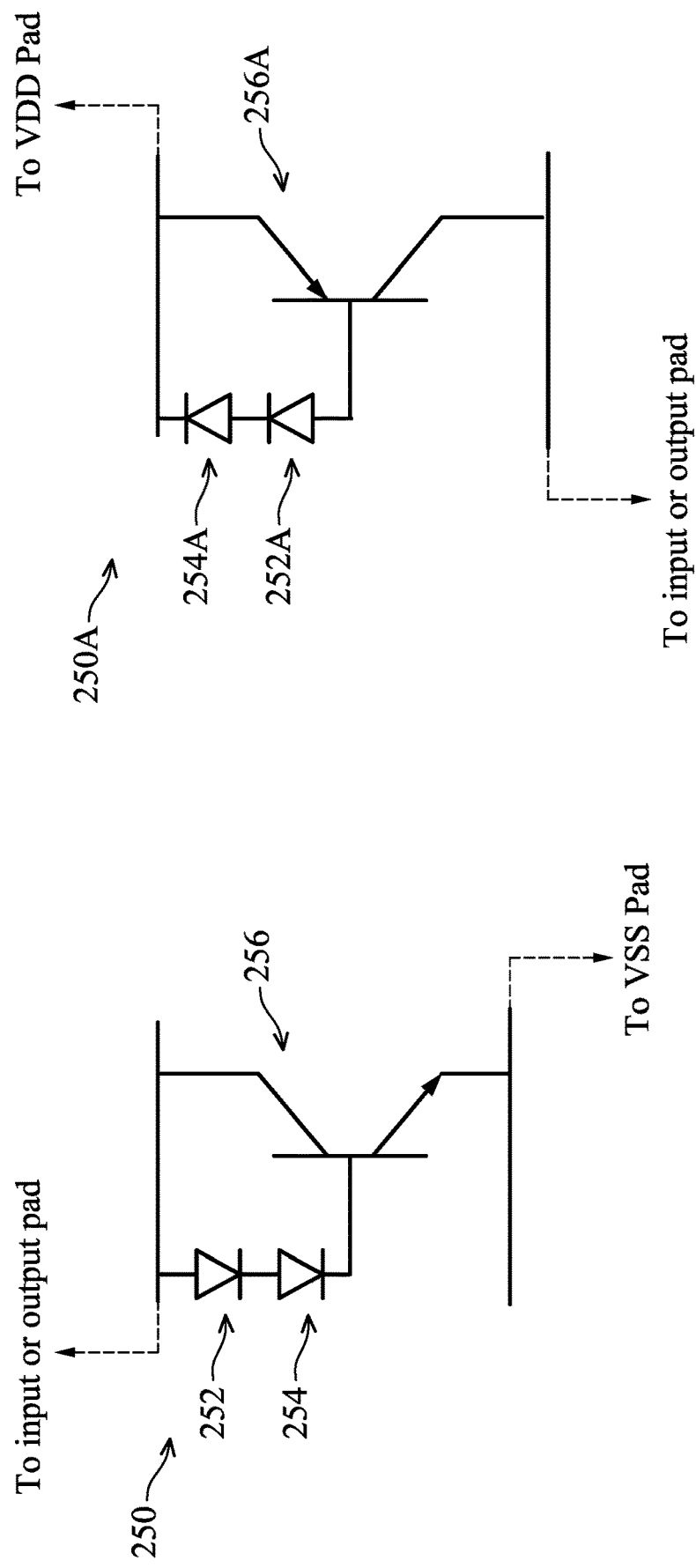

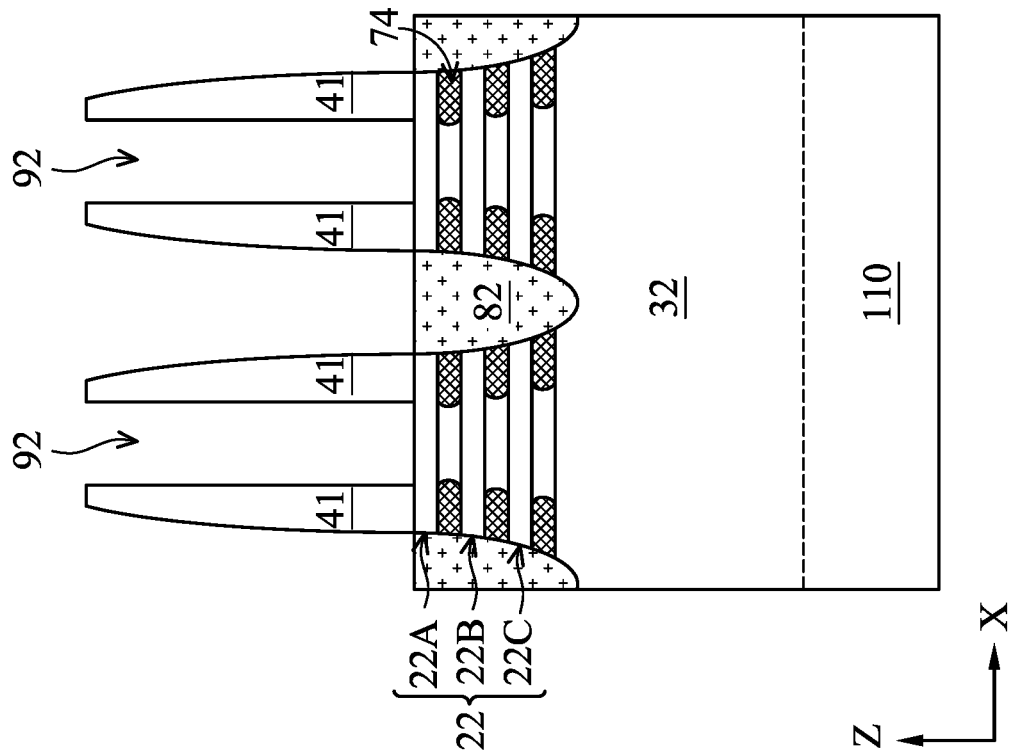
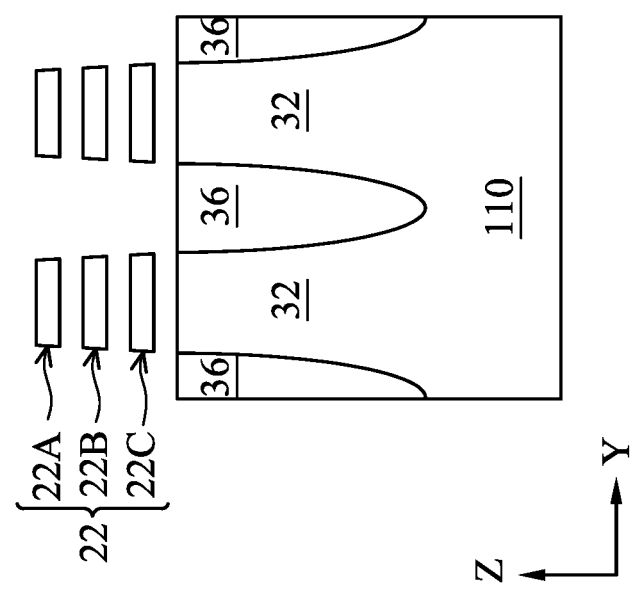
FIG. 9C
FIG. 9B

DEVICE HAVING NANOSTRUCTURE ELECTROSTATIC DISCHARGE STRUCTURE AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1C are circuit schematic diagrams of a portion of an IC device in accordance with embodiments of the present disclosure.

DETAILED DESCRIPTION

Figure 1A:
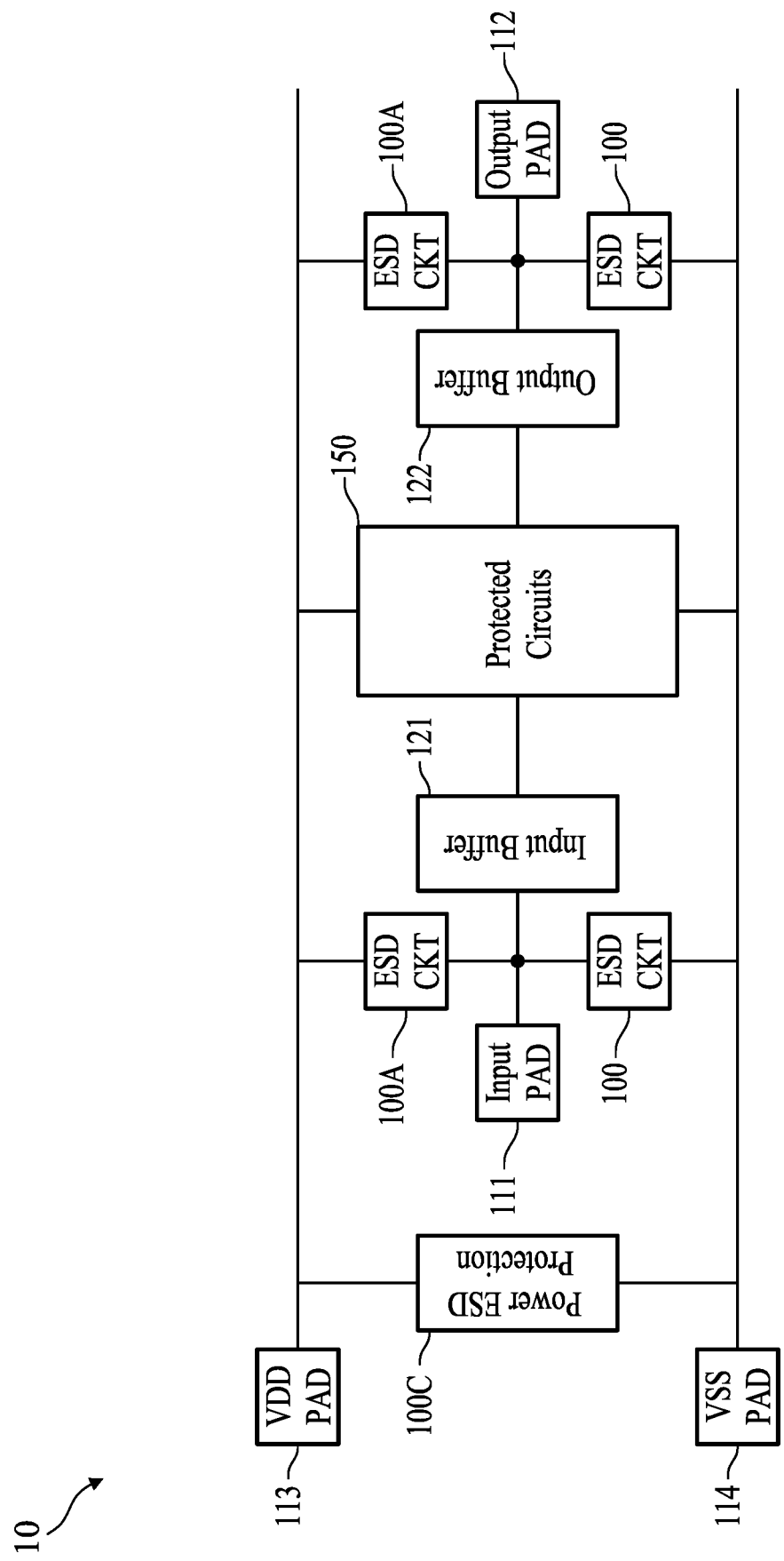

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to electronic devices, and more particularly to electronic devices that include field-effect transistors (FETs), such as planar FETs, three-dimensional fin FETs (FinFETs), or nanostructure FETs, such as gate-all-around (GAA) FETs, nanosheet FETs, nanowire FETs, and the like. In advanced technology nodes, backside interconnect structures, which may include power rails (or "super power rails (SPR)"), are included in integrated circuit (IC) chips to alleviate routing density on a frontside of the IC chip. A device substrate may be removed in a process for forming the backside interconnect structure. This may increase difficulty including an electrostatic discharge (ESD) device as protection for internal circuits of the IC chip.

The ESD device may include an intrinsic bipolar junction transistor (iBJT) and a P-intrinsic-N(PIN) diode (or "PIN diode") in some silicon-on-insulator (SOI) applications. "iBJT" may refer to NiPiN and PiNiP structures, where "i" represents an intrinsic semiconductor region located between N-type and P-type implants. The PiN diode having an intrinsic semiconductor layer between N and P regions or between P and P regions may be implemented in a flexible bottom insulator ("FBI") process. In some semiconductor process nodes, ESD snapback devices may be formed in the device substrate. In processes that remove the device substrate, the FBI process cannot be leveraged. Limited bulk current in backside interconnect processes may cause high trigger voltage (or "Vt1") in ESD snapback devices. Trade-offs between "SOI applications" and "ESD snapback performance" may tend to reduce one or more of performance, power, area and cost of the IC chip.

Embodiments of the disclosure provide an IC chip in which the device substrate is not present, and having an ESD snapback device that is disposed in nanosheets of the IC chip. Insertion of a PIN diode string between base and collector of an iBJT reduces snapback trigger voltage Vt1 and improves turn-on characteristic uniformity. The iBJT may be expanded to an array which improves ESD immunity and on resistance Ron enhancement. Number of PIN diodes in the PIN diode string may be adjusted for different base biases. Different iBJT structures, e.g., NiN, NiPN and the like, may have the PIN diode string connected thereto to boost trigger voltage Vt1.

Embodiments achieve various advantages. Both iBJT and PIN diode string are compatible with backside power processes and non-backside (or frontside) power processes. Intrinsic region(s) of the ESD snapback devices has low leakage current. Thin bulk of the ESD snapback device improves frontside and/or backside metal routing and improves performance, power and area of the IC chip. Array size of the iBJT is scalable for on resistance Ron improvement.

The nanostructure device structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure device structure.

FIGS. 1A-1C are circuit schematic diagrams of a portion of an IC chip 10 in accordance with various embodiments. FIG. 1A is a circuit schematic diagram of a portion of the IC chip 10 that illustrates input/output (I/O) pads connected to internal circuitry, and ESD circuits that protect the internal circuitry. FIG. 1B is a detailed circuit diagram of a first ESD circuit in accordance with various embodiments. FIG. 1C is a detailed circuit diagram of a second ESD circuit in accordance with various embodiments.

In FIG. 1A, a portion of the IC chip 10 is shown. The IC chip 10 includes internal circuitry or "protected circuits" 150, which is protected from ESD by ESD protection circuits 100, 100A, 100C. The protected circuits 150 may include memory circuits, logic circuits or both. The logic circuits may include processor or processing circuits, which may include application processor circuits, image processor circuits, graphics processor circuits, combinations thereof and the like. The protected circuits 150 may include one or more transistors, one or more diodes and one or more passive devices, such as integrated resistors, integrated capacitors, integrated inductors and the like. The protected circuits 150 may have smaller device dimensions, e.g., channel widths, than other circuits of the IC chip 10 shown in FIG. 1A. For example, the protected circuits 150 may include transistors having smaller channel widths than transistors of an input buffer 121, an output buffer 122, or both.

The protected circuits 150 may have one or more inputs that are in data communication with one or more input pads 111. A single input pad 111 is shown for convenience in FIG. 1A. In some embodiments, the protected circuits 150 are connected to tens or hundreds of input pads 111. The input pad 111 is connected to the input buffer 121, which is connected to one or more inputs of the protected circuits 150. In some embodiments, the input buffer 121 is not present.

The protected circuits 150 may have one or more outputs that are in data communication with one or more output pads 112. A single output pad 112 is shown for convenience in FIG. 1A. In some embodiments, the protected circuits 150 are connected to tens or hundreds of output pads 112. The output pad 112 is connected to the output buffer 122, which is connected to one or more outputs of the protected circuits 150. In some embodiments, the output buffer 122 is not present.

The protected circuits 150 may be connected to two or more power supply pads 113, 114, which may include an upper voltage (VDD) pad 113 and a lower voltage (VSS) pad 114. The VSS pad 114 may be connected to a ground voltage or other suitable voltage.

The ESD protection circuits 100, 100A, 100C may include first ESD protection circuits 100, second ESD protection circuits 100A and power ESD protection circuits 100C. The first ESD protection circuits 100 may be connected to the input pad 111 or the output pad 112 and to the VSS pad 114. The second ESD protection circuits 100A may be connected to the input pad 111 or the output pad 112 and to the VDD pad 113. The power ESD protection circuits 100C may be connected to the VDD pad 113 and the VSS pad 114.

The protected circuits 150 may generate output electrical signals based on input electrical signals received via the input pad 111. The protected circuits 150 may output the output electrical signals to the output pad 112. An ESD event, such as presence of a high voltage, at the input pad 111 or the output pad 112 may be mitigated by the first and/or second ESD protection circuits 100, 100A. For example, a high voltage at the input pad 111 may "turn on" the first ESD protection circuit 100 connected thereto, which may route electrical current associated with the high voltage to the VSS pad 114 (e.g., to ground), such that the high voltage is rapidly decreased to a level that will not damage the input buffer 121 and/or the protected circuits 150.

FIG. 1B is a detailed circuit schematic diagram of a first ESD protection circuit 250 in accordance with various embodiments. The first ESD protection circuit 250 may be the first ESD protection circuit 100 in some embodiments. The first ESD protection circuit 250 includes a bipolar junction device 256, which may be a bipolar junction transistor 256. The bipolar junction device 256 may include an NiPiN device, a PiNiP device, an NiPN device, an NiN device, combinations thereof or the like. The bipolar junction device 256 may turn on in the presence of a voltage higher than a trigger voltage Vt1, which may be much higher than a high power supply voltage VDD applied to the VDD pad 113. For example, the high power supply voltage VDD may be in a range of about 0.1 Volts to about 10 Volts, and the trigger voltage Vt1 may be greater than the high power supply voltage VDD, such as in a range of about 1 Volt to thousands of Volts or more.

The first ESD protection circuit 250 includes a PIN diode string having one or more PIN diodes 252, 254 connected in series between a collector of the bipolar junction device 256 and a base of the bipolar junction device 256. Two PIN diodes 252, 254 are illustrated in FIG. 1B. Fewer or more PIN diodes may be included in some embodiments. Increasing the number of PIN diodes in the PIN diode string increases the trigger voltage Vt1 of the bipolar junction device 256.

FIG. 1C is a detailed circuit schematic diagram of a second ESD protection circuit 250A in accordance with various embodiments. The second ESD protection circuit 250A may be the second ESD protection circuit 100A in some embodiments. The second ESD protection circuit 250A includes a bipolar junction device 256A, which may be a bipolar junction transistor 256A. The second ESD protection circuit 250A is similar in many respects to the first ESD protection circuit 250, other than polarities of the bipolar junction device 256A and orientation of the PIN diodes 252A, 254A are reverse those of the bipolar junction device 256 and the PIN diodes 252, 254, respectively.

Figure 16:
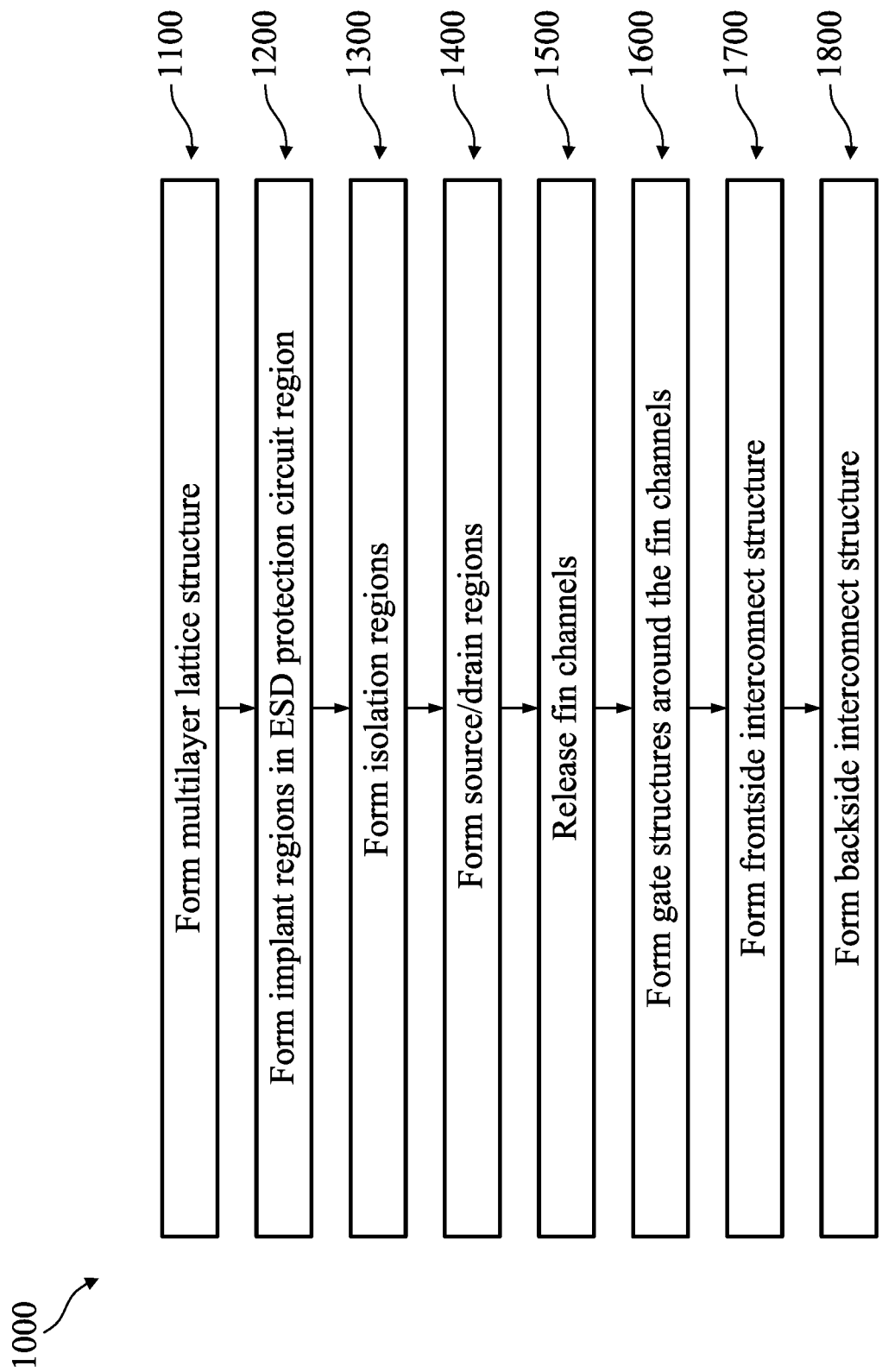
FIG. 16 is a flowchart illustrating a method of fabricating a semiconductor device according to various aspects of the present disclosure.

FIGS. 2A-12 are views of various embodiments of an IC device at various stages of fabrication according to various aspects of the present disclosure. FIG. 16 is a flowchart illustrating a method of fabricating a semiconductor device according to various aspects of the present disclosure. The various stages of fabrication of the IC device illustrated in FIGS. 2A-12 may be performed in accordance with the method of FIG. 16. FIG. 16 illustrates a flowchart of method 1000 for forming an IC device or a portion thereof from a workpiece, according to one or more aspects of the present disclosure. Method 1000 is an example and is not intended to limit the present disclosure to what is explicitly illustrated in method 1000. Additional acts can be provided before, during and after the method 1000 and some acts described can be replaced, eliminated, or moved around for additional embodiments of the methods. Not all acts are described herein in detail for reasons of simplicity. Method 1000 is described below in conjunction with fragmentary perspective and/or cross-sectional views of a workpiece, shown in FIGS. 2A-12, at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as is beneficial to the context.

FIGS. 2A through 12 are perspective views and cross-sectional views of intermediate stages in the manufacturing of FETs, such as nanosheet FETs, in accordance with some embodiments. FIGS. 2A, 3A, 4A, 5A, 6A, 7A, 8A, 9A and 10A illustrate perspective views. FIGS. 2B, 3B, 4B, 5B, 6B, 7B, 8B, 9B and 10B illustrate side views taken along reference cross-section B-B' (gate cut) shown in FIGS. 2A, 3A, 4A. FIGS. 4C, 5C, 6C, 7C, 8C, 9C, 10C illustrate side views taken along reference cross-section C-C' (channel/fin cut) illustrated in FIG. 4A. Further side views taken along reference cross-section B-B' are illustrated in FIGS. 2C and 3C.

Figure 2B:
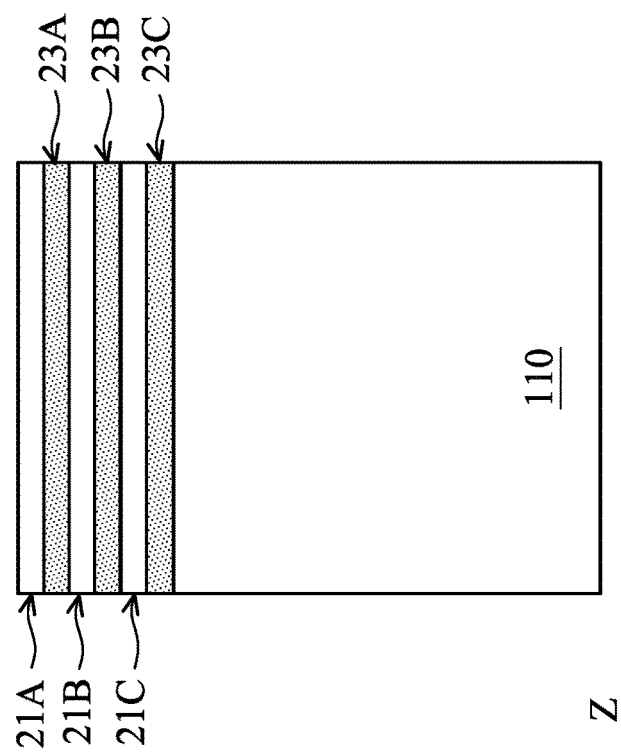
FIGS. 2A-12 are views of various embodiments of an IC device at various stages of fabrication according to various aspects of the present disclosure.
Figure 2A:
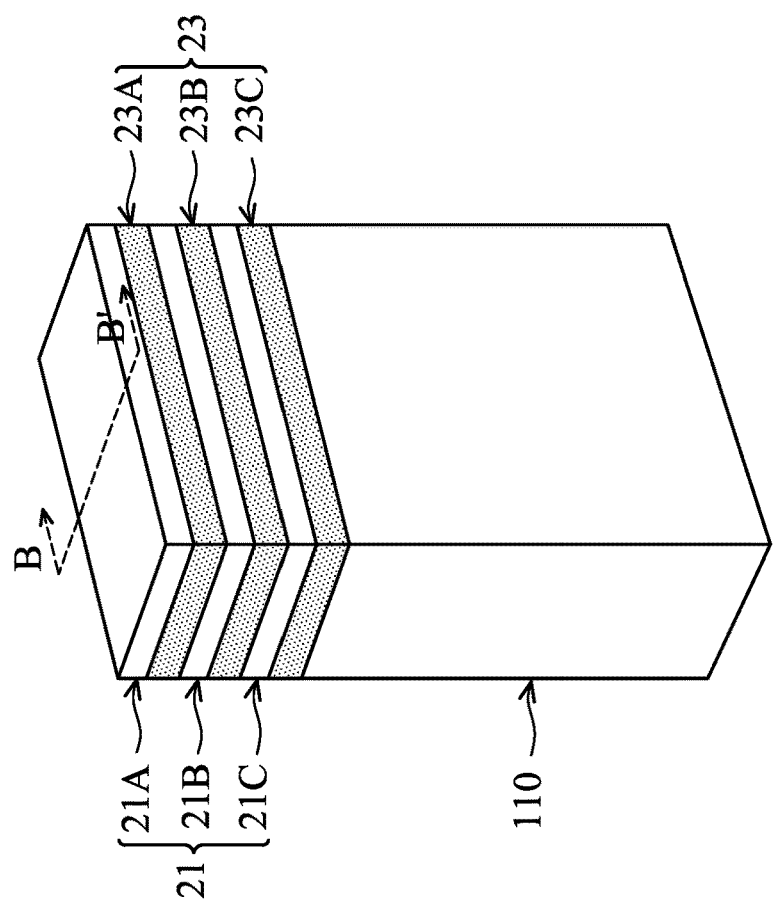

In FIG. 2A and FIG. 2B, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2A and FIG. 2B, a multi-layer stack 25 or "lattice" is formed over the substrate 110 of alternating layers of first semiconductor layers 21A-21C (collectively referred to as first semiconductor layers 21) and second semiconductor layers 23A-23C (collectively referred to as second semiconductor layers 23), corresponding to act 1100 of FIG. 16. In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like.

Three layers of each of the first semiconductor layers 21 and the second semiconductor layers 23 are illustrated. In some embodiments, the multi-layer stack 25 may include one or two each or four or more each of the first semiconductor layers 21 and the second semiconductor layers 23. Although the multi-layer stack 25 is illustrated as including a second semiconductor layer 23C as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nanostructure FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nanostructure FETs.

Figure 2C:
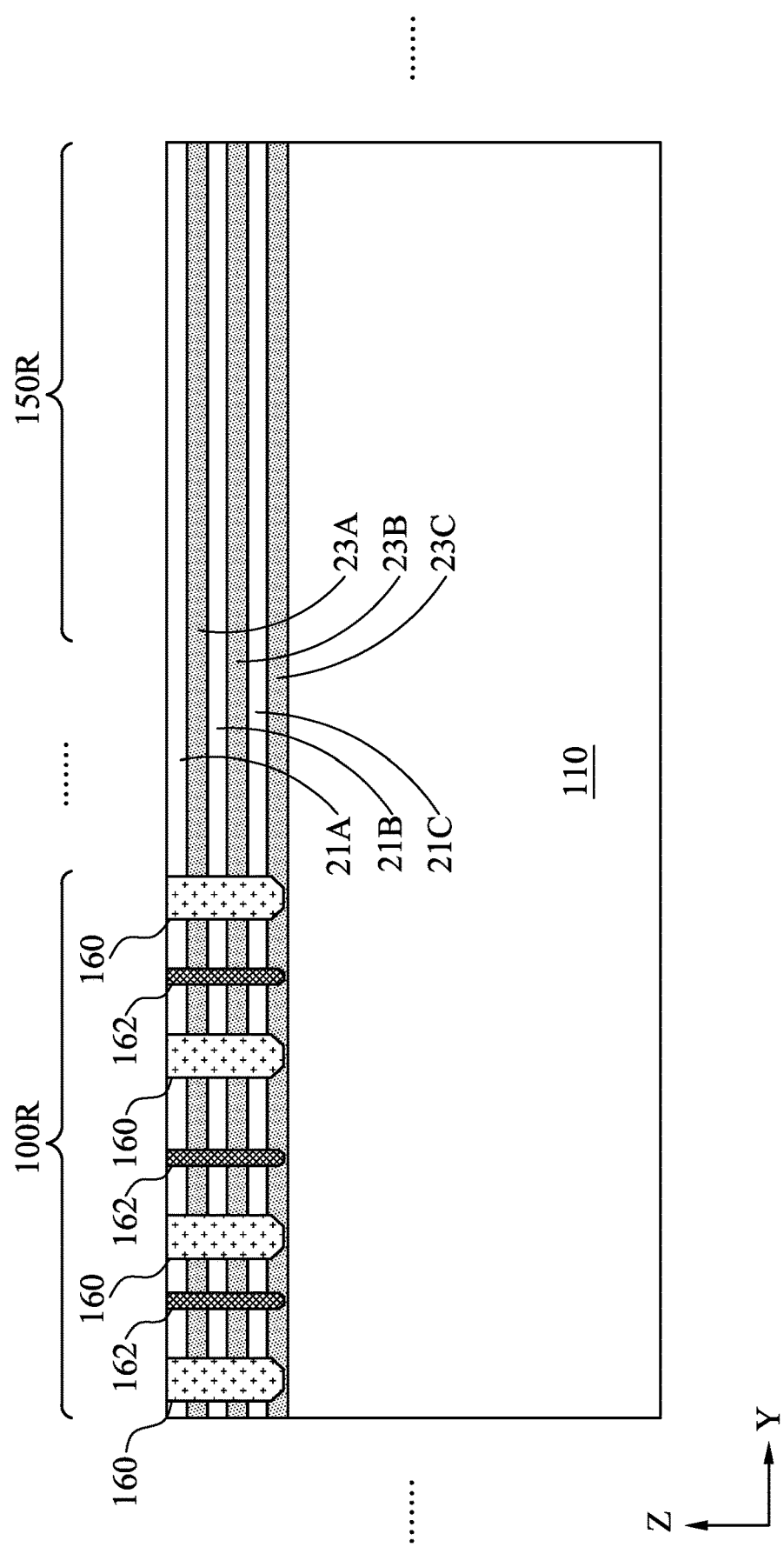

In FIG. 2C, an internal circuitry device region 150R is laterally offset from an ESD protection device region 100R. The internal circuitry device region 150R may be a region of an IC chip, such as the IC chip 10, in which internal circuitry, such as the internal circuitry 150, is disposed. The ESD protection device region 100R may be a region of the IC chip, e.g., the IC chip 10, in which ESD protection circuits, such as the ESD protection circuits 100, 100A, 100C, are disposed.

In FIG. 2C, following formation of the multi-layer lattice 25, one or more implant operations may be performed in the ESD protection device region 100R while the internal circuitry device region 150R is protected, e.g., by a photoresist mask, corresponding to act 1200 of FIG. 16. The implant operations may form first implant regions 160 of a first type by a first implant operation, and may form second implant regions 162 of a second type by a second implant operation. The first type may be different from the second type. For example, the first type may be N-type and the second type may be P-type. The first implant operation may implant N-type dopants or impurities in the first implant regions 160, which may be exposed by a first patterned mask, such as a first photoresist mask. The second implant operation may implant P-type dopants or impurities in the second implant regions 162, which may be exposed by a second patterned mask, such as a second photoresist mask. The first implant regions 160 may be implanted prior to the second implant regions 162, or the second implant regions 162 may be implanted prior to the first implant regions 160. The N-type dopants may include one or more of phosphorus, arsenic, antimony, or another suitable N-type dopant. The P-type dopants may include one or more of gallium, boron, boron fluoride, indium, or another suitable P-type dopant. Concentration of the N-type and P-type dopants may each be in a range of about $10^{13}$ cm$^{-3}$ to $10^{18}$ cm$^{-3}$, though other values less or greater than those mentioned may also be used. Concentration of the N-type dopants in the first implant regions 160 may be different than concentration of the P-type dopants in the second implant regions 162. Arrangement of the first and second dopant regions 160, 162 is discussed in greater detail with reference to FIGS. 13-15.

An anneal may be performed after the implants to repair implant damage and to activate the P-type and/or N-type impurities. In some embodiments, in situ doping during epitaxial growth of the fins 32 and the nanostructures 22, 24 may obviate separate implantations, although in situ and implantation doping may be used together.

Figure 3B:
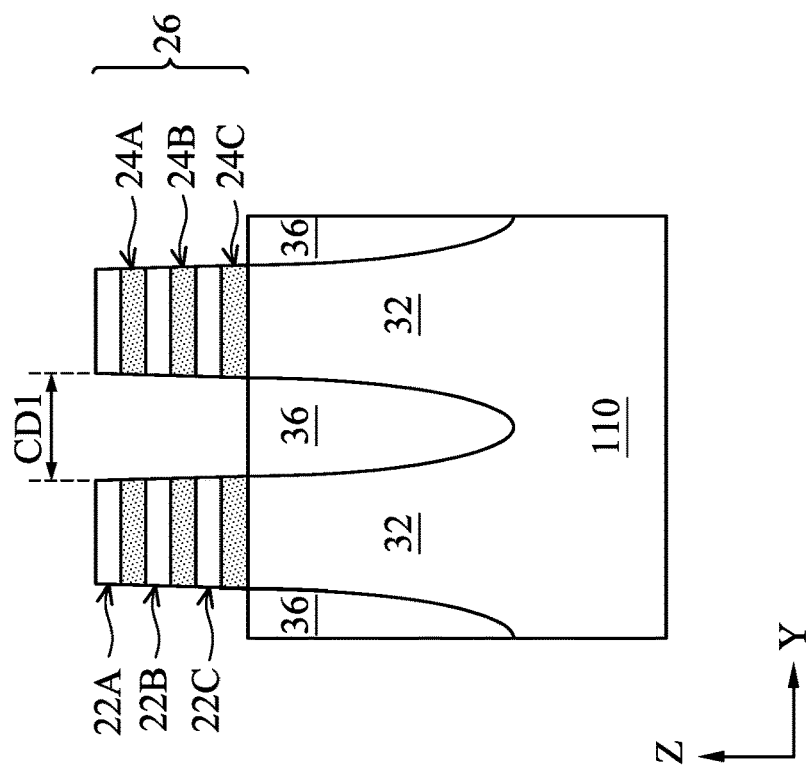
Figure 3A:
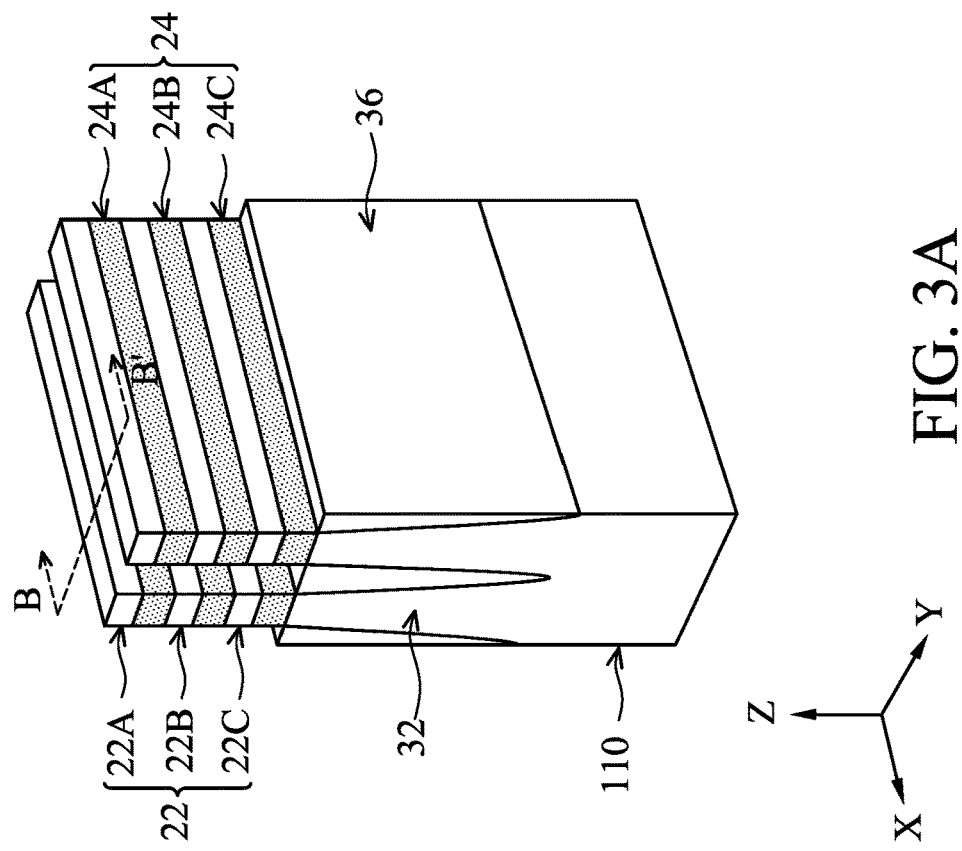

In FIG. 3A and FIG. 3B, fins 32 and vertical stacks 26 of nanostructures 22, 24 are formed in the substrate 110 and the multi-layer stack 25 corresponding to act 1300 of FIG. 16. In some embodiments, the nanostructures 22, 24 and the fins 32 may be formed by etching trenches in the multi-layer stack 25 and the substrate 110. The etching may be any acceptable etch process, such as a reactive ion etch (RIE), neutral beam etch (NBE), the like, or a combination thereof. The etching may be anisotropic. First nanostructures 22A-22C (also referred to as "channels" below) are formed from the first semiconductor layers 21, and second nanostructures 24A-24C are formed from the second semiconductor layers 23. Distance CDI between adjacent fins 32 and nanostructures 22, 24 may be from about 18 nm to about 100 nm. A portion of the device 10 is illustrated in FIGS. 3A and 3B including two fins 32 for simplicity of illustration. The process 1000 illustrated in FIGS. 2A-12 may be extended to any number of fins, and is not limited to the two fins 32 shown in FIGS. 3A-11.

The fins 32 and the nanostructures 22, 24 may be patterned by any suitable method. For example, one or more photolithography processes, including double-patterning or multi-patterning processes, may be used to form the fins 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

FIGS. 3A and 3B illustrate the fins 32 having tapered sidewalls, such that a width of each of the fins 32 and/or the nanostructures 22, 24 continuously increases in a direction towards the substrate 110. In such embodiments, each of the nanostructures 22, 24 may have a different width and be trapezoidal in shape. In other embodiments, the sidewalls are substantially vertical (non-tapered), such that width of the fins 32 and the nanostructures 22, 24 is substantially similar, and each of the nanostructures 22, 24 is rectangular in shape.

In FIGS. 3A and 3B, isolation regions 36, which may be shallow trench isolation (STI) regions, are formed adjacent the fins 32, corresponding to act 1300 of FIG. 16. The isolation regions 36 may be formed by depositing an insulation material over the substrate 110, the fins 32, and nanostructures 22, 24, and between adjacent fins 32 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 32, and the nanostructures 22, 24. Thereafter, a fill material, such as those discussed above may be formed over the liner.

The insulation material undergoes a removal process, such as a chemical mechanical polish (CMP), an etch-back process, combinations thereof, or the like, to remove excess insulation material over the nanostructures 22, 24. Top surfaces of the nanostructures 22, 24 may be exposed and level with the insulation material after the removal process is complete.

The insulation material is then recessed to form the isolation regions 36. After recessing, the nanostructures 22, 24 and upper portions of the fins 32 may protrude from between neighboring isolation regions 36. The isolation regions 36 may have top surfaces that are flat as illustrated, convex, concave, or a combination thereof. In some embodiments, the isolation regions 36 are recessed by an acceptable etching process, such as an oxide removal using, for example, dilute hydrofluoric acid (dHF), which is selective to the insulation material and leaves the fins 32 and the nanostructures 22, 24 substantially unaltered.

FIGS. 2A through 3B illustrate one embodiment (e.g., etch last) of forming the fins 32 and the nanostructures 22, 24. In some embodiments, the fins 32 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

In some embodiments, the spacing between the channels 22A-22C (e.g., between the channel 22B and the channel 22A or the channel 22C) is in a range between about 8 nanometers (nm) and about 12 nm. In some embodiments, a thickness (e.g., measured in the Z-direction) of each of the channels 22A-22C is in a range between about 5 nm and about 8 nm. In some embodiments, a width (e.g., measured in the Y-direction) of each of the channels 22A-22C is at least about 8 nm.

Figure 3C:
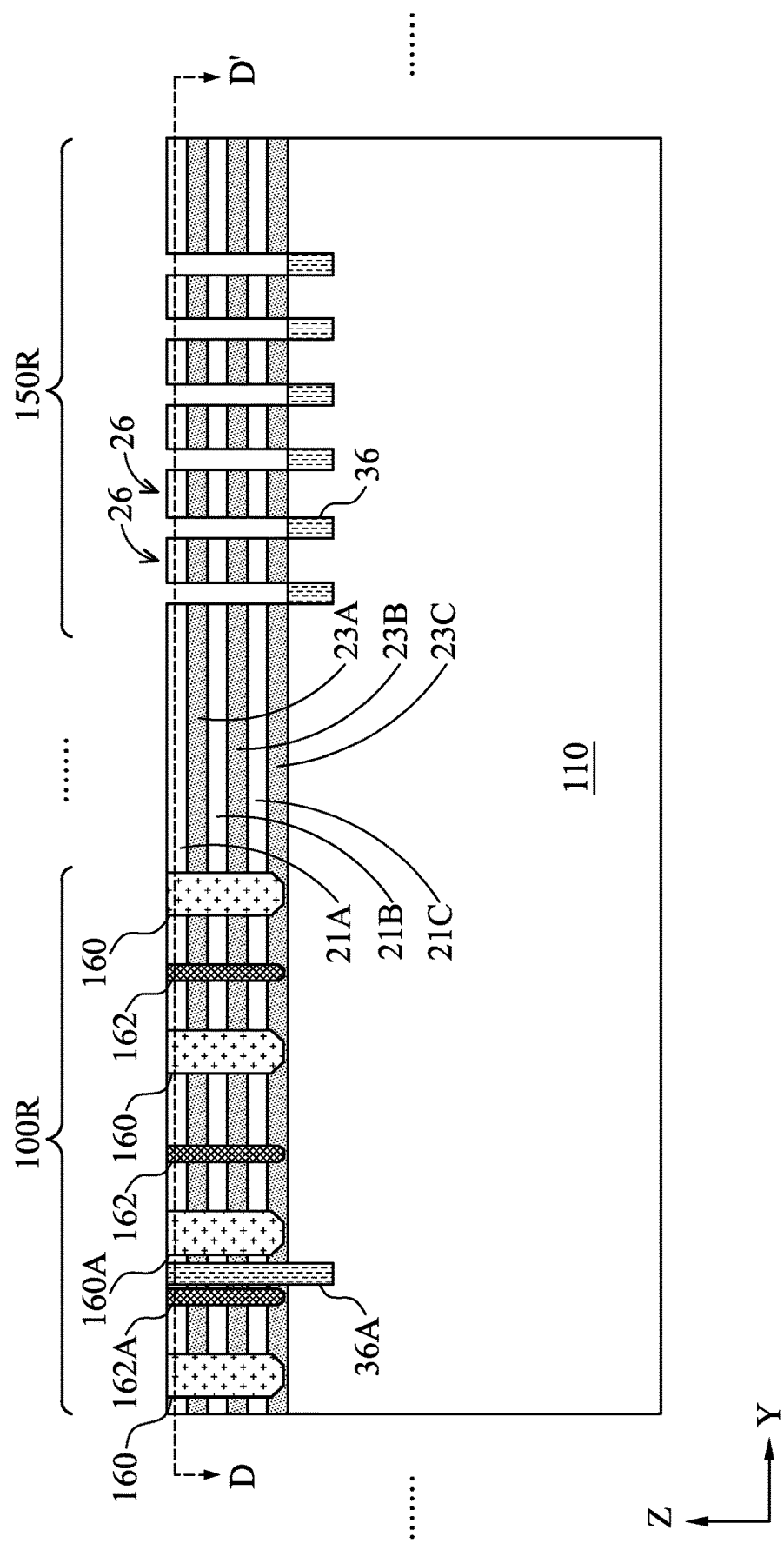

In FIG. 3C, the internal circuitry device region 150R is laterally offset from the ESD protection device region 100R. In the internal circuitry device region 150R, the isolation regions 36 are positioned between neighboring pairs of vertical stacks 26 of nanostructures 22, 24 or adjacent a single vertical stack 26. The isolation regions 36 are recessed as described, such that the upper surfaces thereof are at or around the upper surface of the fins 32 and/or the lower surface of the vertical stacks 26 (e.g., the lower surface of the bottommost nanostructure 24C).

In the ESD protection device region 100R, one or more isolation regions 36A (or "second isolation regions 36A") is positioned between respective neighboring pairs of implant regions 160, 162. For example, as shown in FIG. 3C, the second isolation region 36A is disposed between a first implant region 160 on a right side thereof and a second implant region 162 on a left side thereof. In FIG. 3C, the first implant region 160A and the second implant regions 162A are "directly adjacent" the second isolation region 36A. Being directly adjacent in this context may refer to being adjacent to without additional first or second implant regions 160, 162 therebetween. In some embodiments, the second isolation region 36A may be disposed between (e.g., directly adjacent to) two first implant regions 160 or between (e.g., directly adjacent to) two second implant regions 162 on either side thereof.

The second isolation regions 36A may be formed in the same process as the isolation regions 36 of the internal circuitry device region 150R, and may be the same material as the isolation regions 36. When the isolation regions 36 are recessed, the second isolation regions 36A may be protected, for example, by a photoresist mask. The second isolation regions 36A are taller than the isolation regions 36. Upper surfaces of the second isolation regions 36A are at a level higher than the upper surfaces of the isolation regions 36. The upper surface of the second isolation region 36A shown in FIG. 3C is substantially coplanar with upper surfaces of the uppermost channels 22A and/or the first semiconductor layer 21A. The second isolation region 36A extending to the uppermost layer 21A of the first semiconductor layers 21 is advantageous to provide physical and electrical isolation between devices on either side of the second isolation region 36A. For example, the second isolation region 36A may be positioned between the PIN diode 252 and the PIN diode 254, which improves electrical isolation between the two PIN diodes 252, 254 through the semiconductor layers 21, 23.

In the description of FIGS. 2C and 3C, the implant regions 160, 162 are formed prior to forming the isolation regions 36, 36A. In some embodiments, the implant regions 160, 162 are formed following forming the isolation regions 36, 36A. For example, the implant regions 160, 162 may be formed following formation of the isolation regions 36, 36A and prior to formation of sacrificial gate structures 40 described with reference to FIGS. 4A-4C. In some embodiments, no epitaxial structure (e.g., source/drain regions) are formed when implants are present in a BJT structure, for example, due to epitaxial blocking layers being present in a layout including the structure shown in the Figures. Implant regions 160, 162 may be formed after the process described with reference to FIG. 4C while no strained source/drain (SSD) etch has been performed in the channels 22. Prior to and following formation of the implant regions 160, 162, the ESD protection device region 100R may be protected by a mask, such as a photoresist mask, for example, during processing that forms features (e.g., source/drain regions, gate structures, and the like) of the internal circuitry device region 150R.

Further in FIG. 3A and FIG. 3B, appropriate wells (not separately illustrated) may be formed in the fins 32, the nanostructures 22, 24, and/or the isolation regions 36. Using masks, an N-type impurity implant may be performed in P-type regions of the substrate 110, and a P-type impurity implant may be performed in N-type regions of the substrate 110. Example N-type impurities may include phosphorus, arsenic, antimony, or the like. Example P-type impurities may include boron, boron fluoride, indium, or the like. An anneal may be performed after the implants to repair implant damage and to activate the P-type and/or N-type impurities. In some embodiments, in situ doping during epitaxial growth of the fins 32 and the nanostructures 22, 24 may obviate separate implantations, although in situ and implantation doping may be used together.

Figure 3D:
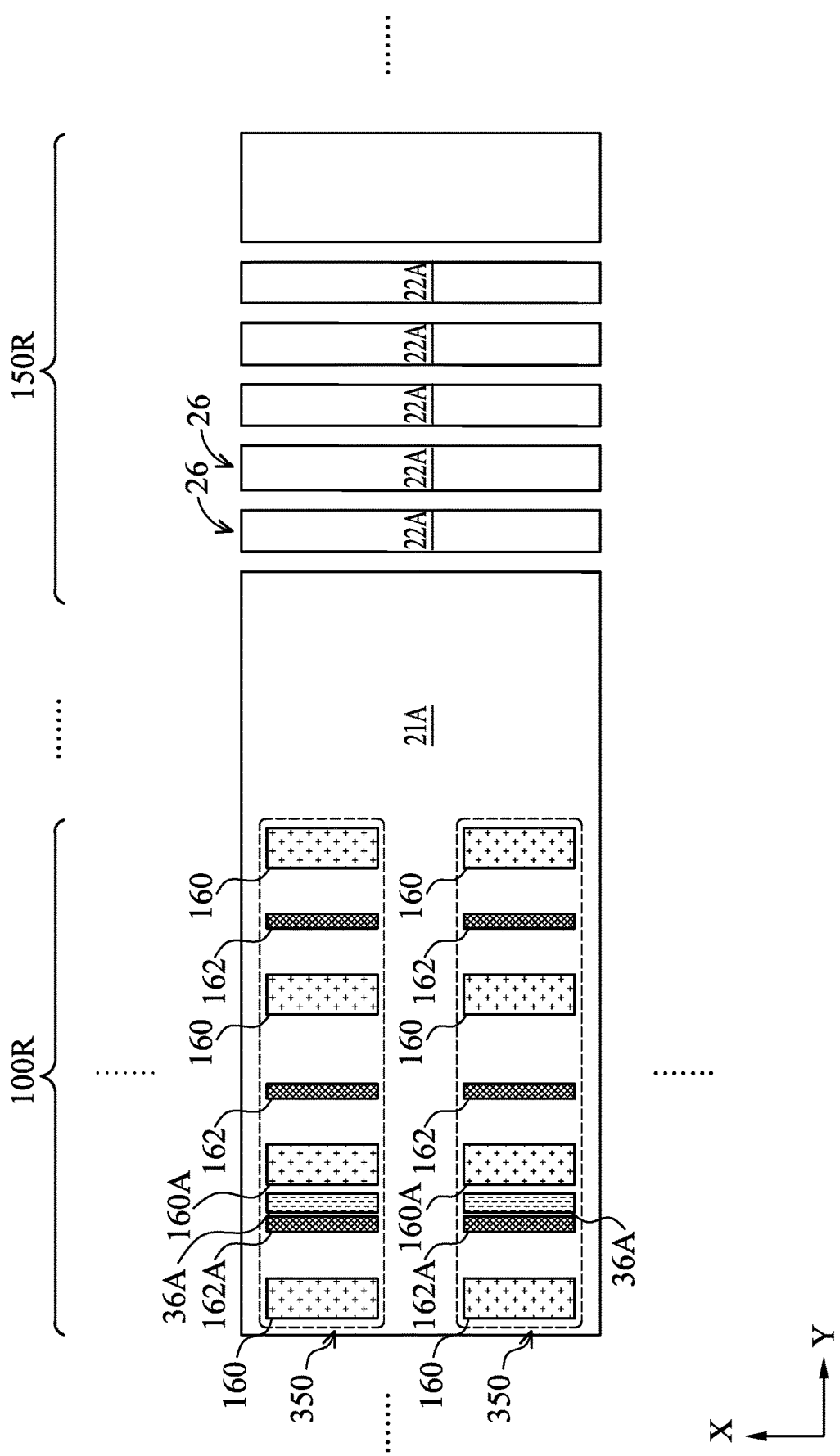

FIG. 3D is a cross-sectional plan view of the IC chip 10 along cross-sectional line D-D' of FIG. 3C. In some embodiments, the IC chip 10 may include one or more ESD protection circuit regions 350. The ESD protection circuits 100, 100A, 250, 250A may each include one or more of the ESD protection circuit regions 350. For example, the ESD protection circuit 100 may include an array of the ESD protection circuit regions 350 that may include two or more of the ESD protection circuit regions 350. Electrical interconnection between the ESD protection circuit regions 350 and the pads 111, 112, 113, 114 is described in greater detail with reference to FIGS. 13-15. The second isolation regions 36A are shown as separated from each other in the X-axis direction in FIG. 3D.

Figure 4A:
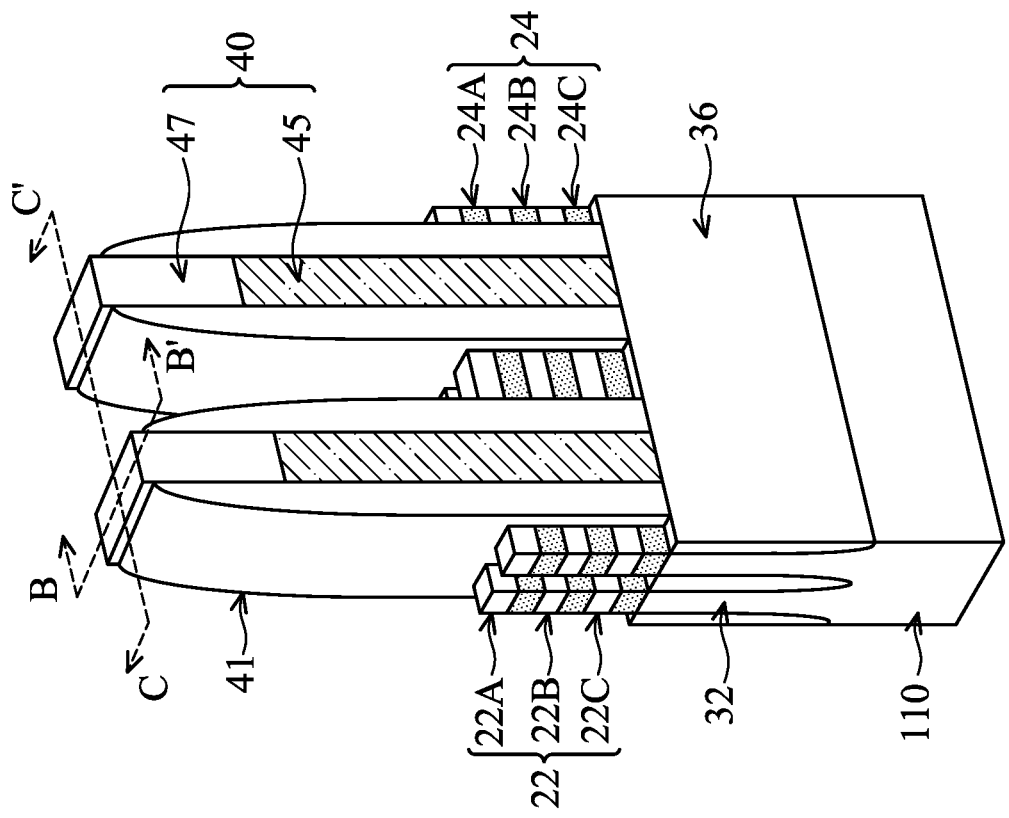
Figure 4A:
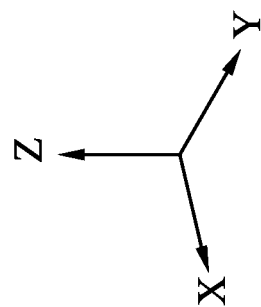
Figure 4C:
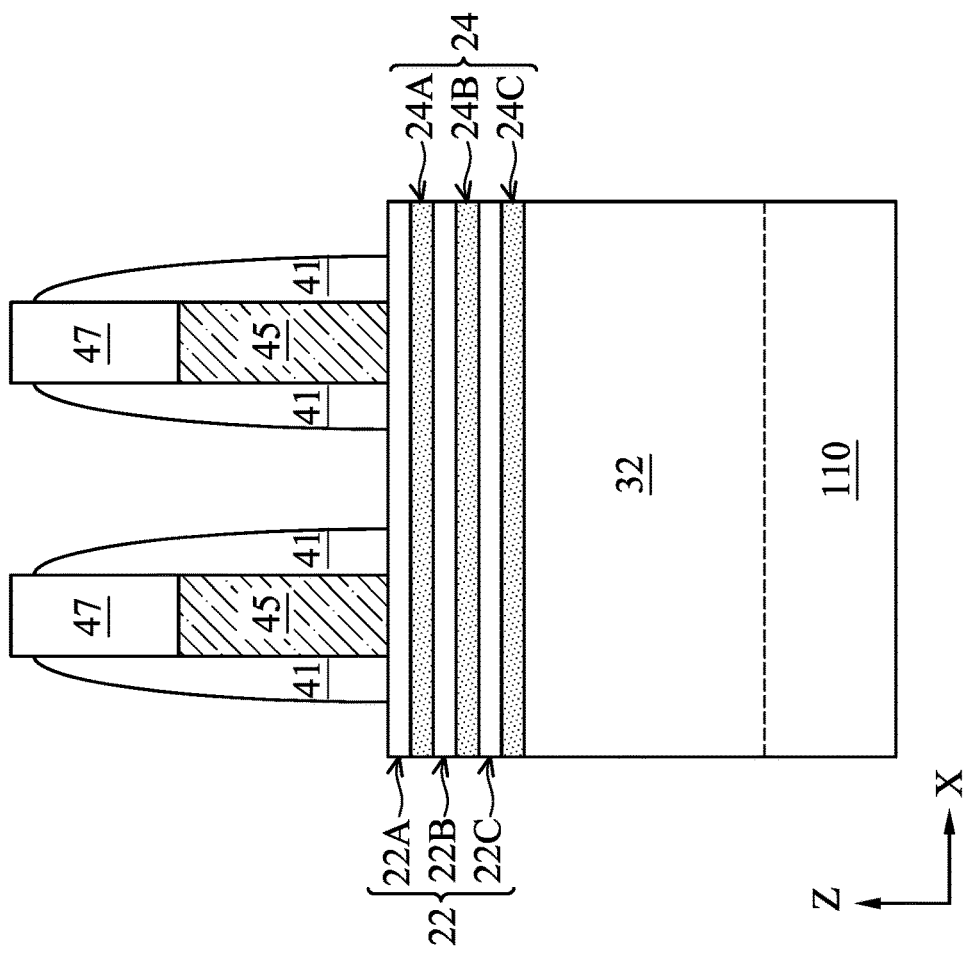
Figure 4B:
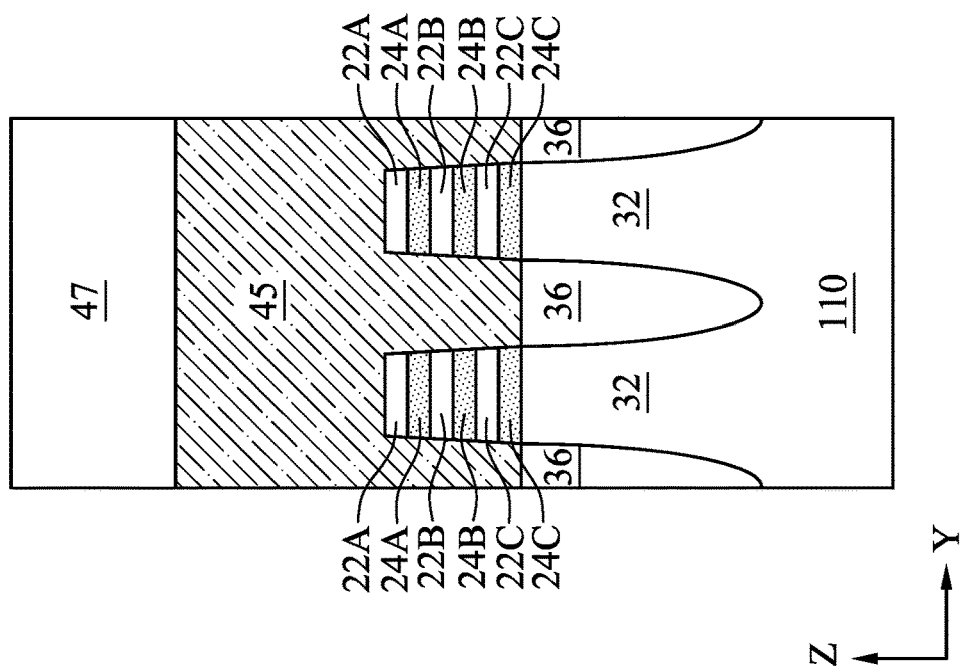

In FIGS. 4A-4C, dummy or sacrificial gate structures 40 are formed over the fins 32 and/or the nanostructures 22, 24. A dummy gate layer 45 is formed over the fins 32 and/or the nanostructures 22, 24. The dummy gate layer 45 may be made of materials that have a high etching selectivity versus the isolation regions 36. The dummy gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. The mask layer 47 may include one or more layers, such as a first mask layer and a second mask layer. The first mask layer may be formed in a first deposition process, and the second mask layer may be formed in a second deposition process following the first deposition process. In some embodiments, a gate dielectric layer is formed before the dummy gate layer 45 between the dummy gate layer 45 and the fins 32 and/or the nanostructures 22, 24.

A spacer layer or sidewall spacer 41 is formed over sidewalls of, and covering, the mask layer 47 and the dummy gate layer 45. The spacer layer 41 is made of an insulating material, such as silicon nitride, silicon oxide, silicon carbo-nitride, silicon oxynitride, silicon oxy carbo-nitride, or the like, and may have a single-layer structure or a multi-layer structure including a plurality of dielectric layers, in accordance with some embodiments. The spacer layer 41 may be formed by depositing a spacer material layer (not shown) over the mask layer 47 and the dummy gate layer 45. In some embodiments, the spacer layer 41 includes one or more material layers. For example, the spacer layer 41 may include a first spacer layer in contact with the dummy gate structures 40, and a second spacer layer in contact with the first spacer layer. The first spacer layer may be formed in a first deposition process, and the second spacer layer may be formed in a second deposition process following the first deposition process. Portions of the spacer material layer between dummy gate structures 40 are removed using an anisotropic etching process, in accordance with some embodiments.

FIGS. 4A-4C illustrate one process for forming the spacer layer 41. In some embodiments, the spacer layer 41 is formed alternately or additionally after removal of the dummy gate layer 45. In such embodiments, the dummy gate layer 45 is removed, leaving an opening, and the spacer layer 41 may be formed by conformally coating material of the spacer layer 41 along sidewalls of the opening. The conformally coated material may then be removed from the bottom of the opening corresponding to the top surface of the uppermost channel, e.g., the channel 22A, prior to forming an active gate, such as the gate structure 200.

Figure 5A:
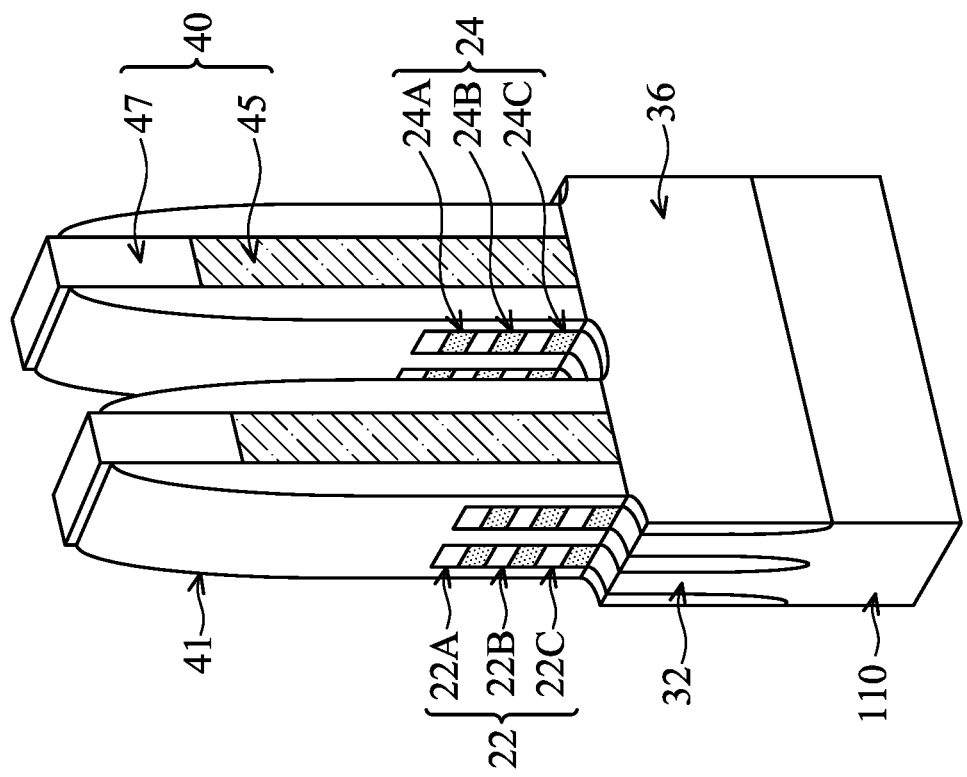
Figure 5A:
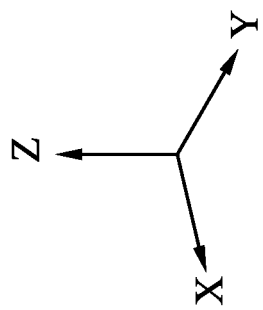
Figure 5C:
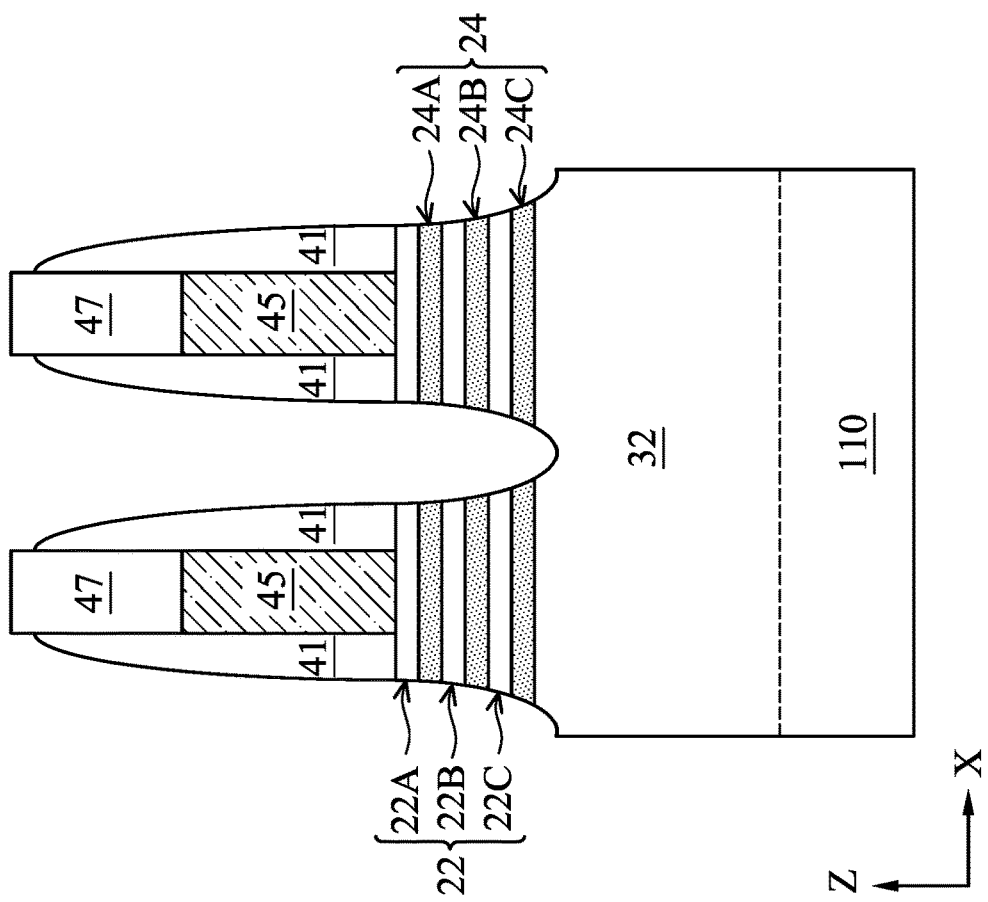
Figure 5B:
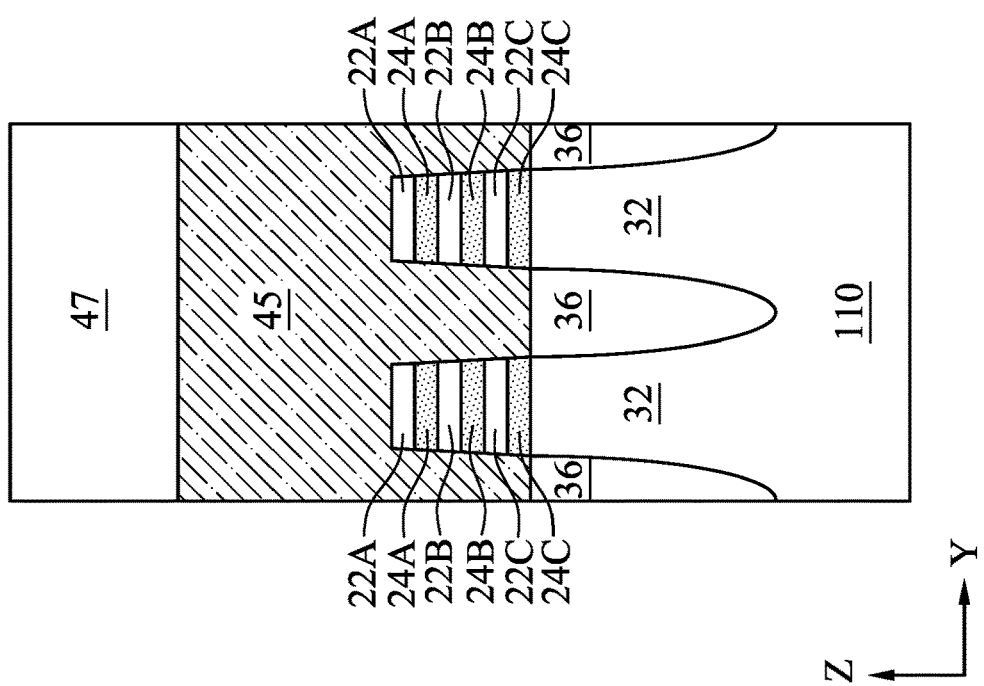

In FIGS. 5A-5C, an etching process is performed to etch the portions of protruding fins 32 and/or nanostructures 22, 24 that are not covered by dummy gate structures 40, resulting in the structure shown. The recessing may be anisotropic, such that the portions of fins 32 directly underlying dummy gate structures 40 and the spacer layer 41 are protected, and are not etched. The top surfaces of the recessed fins 32 may be substantially coplanar with the top surfaces of the isolation regions 36 as shown, in accordance with some embodiments. The top surfaces of the recessed fins 32 may be lower than the top surfaces of the isolation regions 36, in accordance with some other embodiments. FIG. 5C shows two vertical stacks of nanostructures 22, 24 following the etching process for simplicity. In general, the etching process may be used to form any appropriate number of vertical stacks of nanostructures 22, 24 over the fins 32.

Figure 6A:
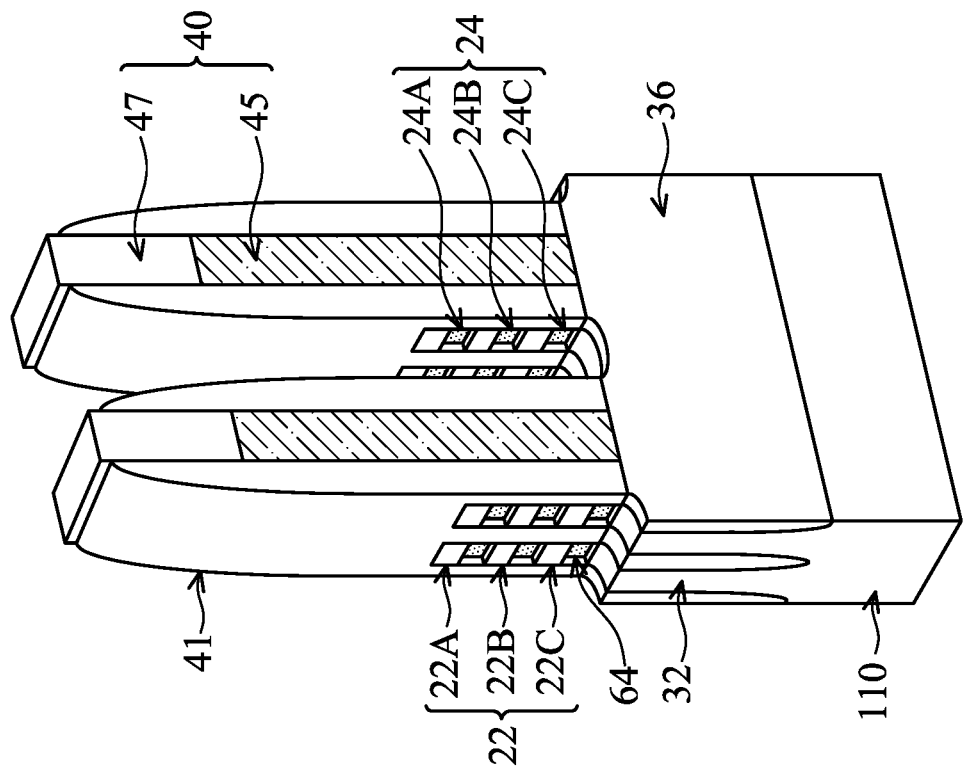
Figure 6C:
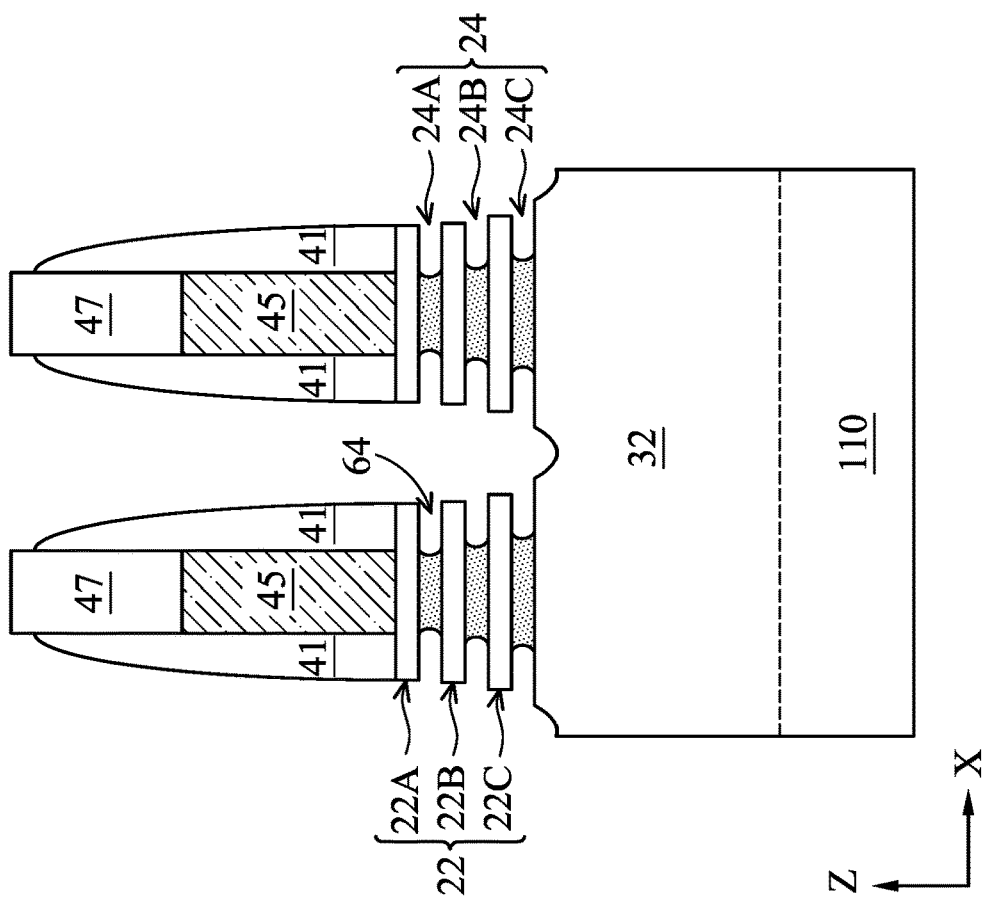
Figure 6B:
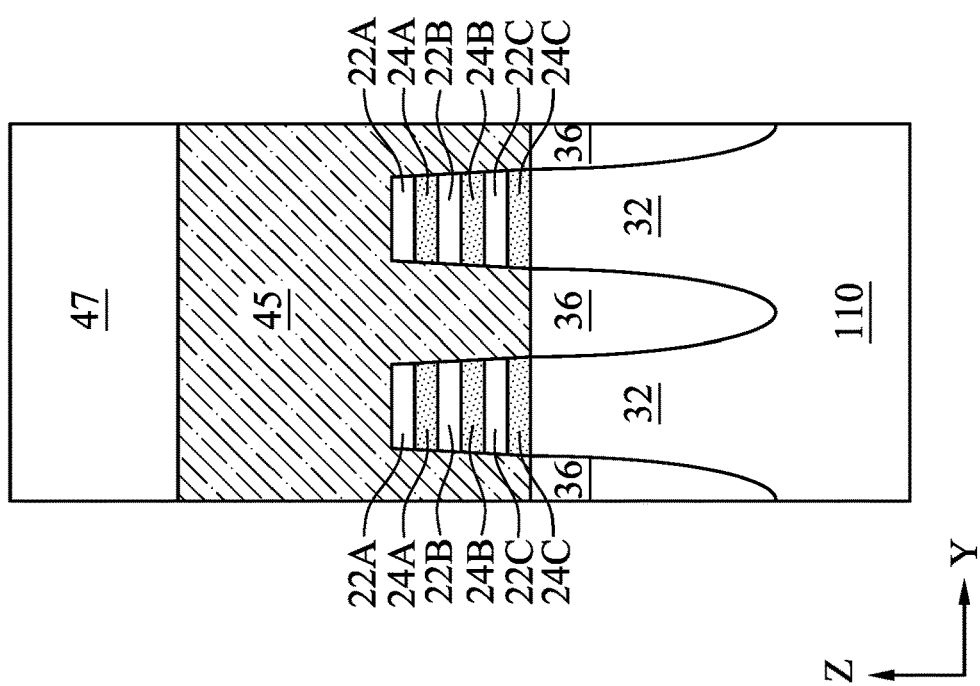

FIGS. 6A-6D and 7A-7C illustrate formation of inner spacers 74. A selective etching process is performed to recess end portions of the nanostructures 24 exposed by openings in the spacer layer 41 without substantially attacking the nanostructures 22. After the selective etching process, recesses 64 are formed in the nanostructures 24 at locations where the removed end portions used to be. The resulting structure is shown in FIGS. 6A-6C.

Figure 7A:
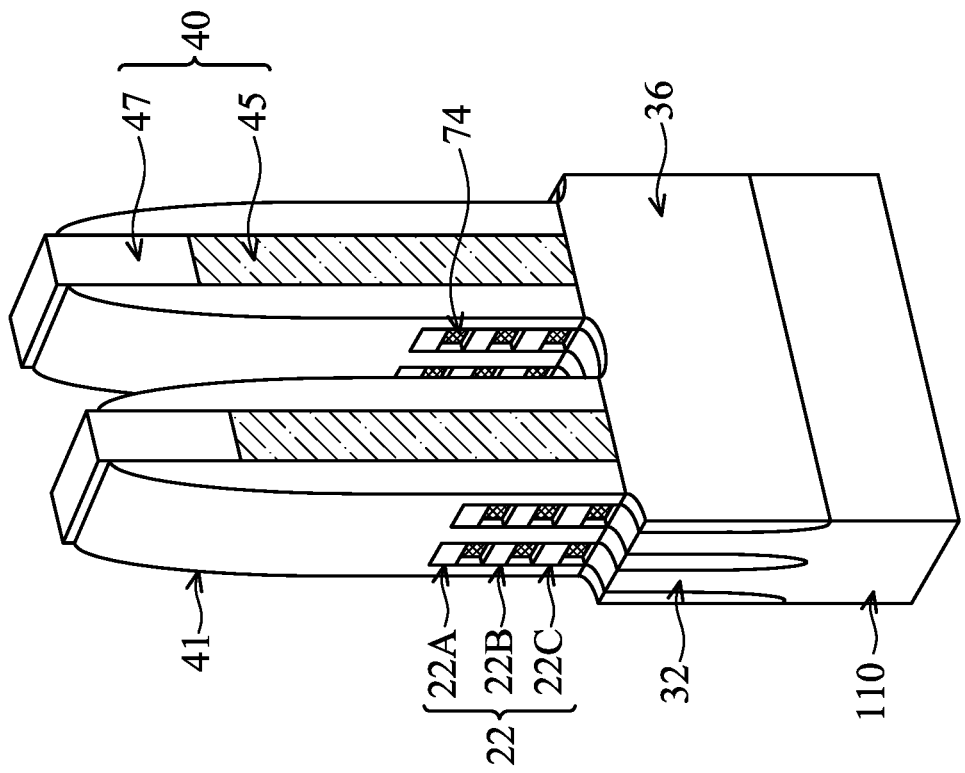
Figure 7C:
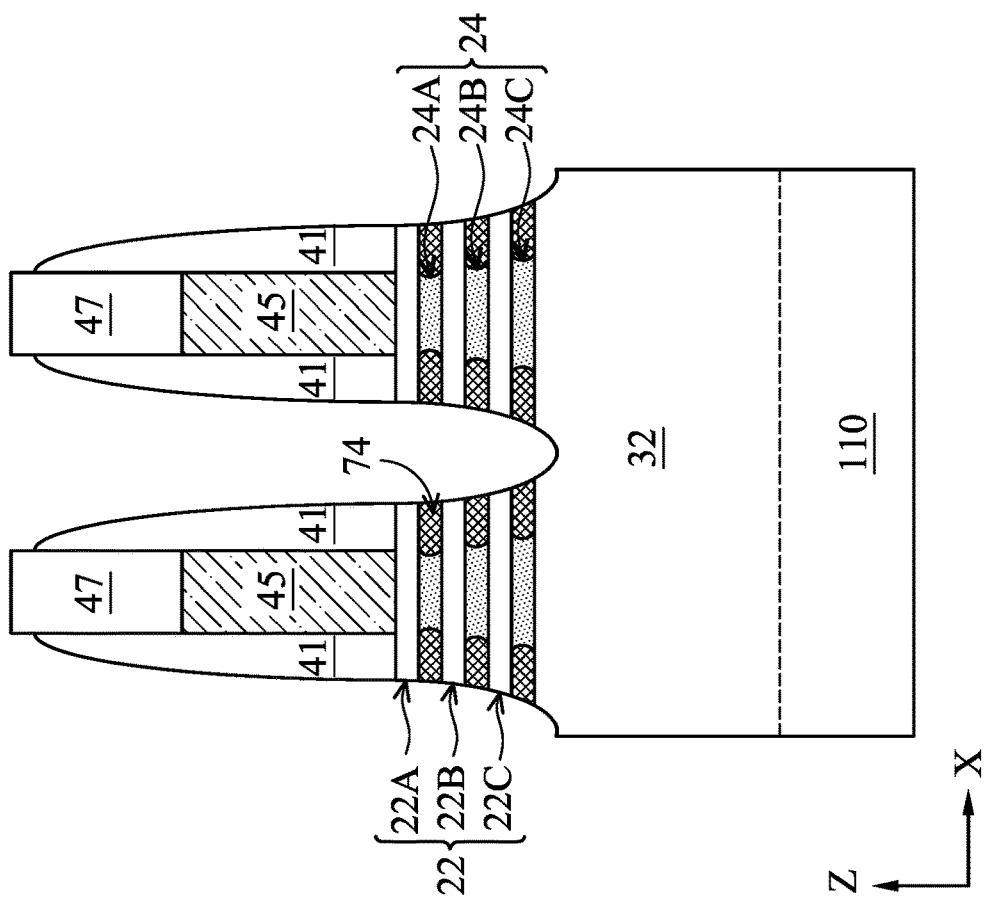
Figure 7B:
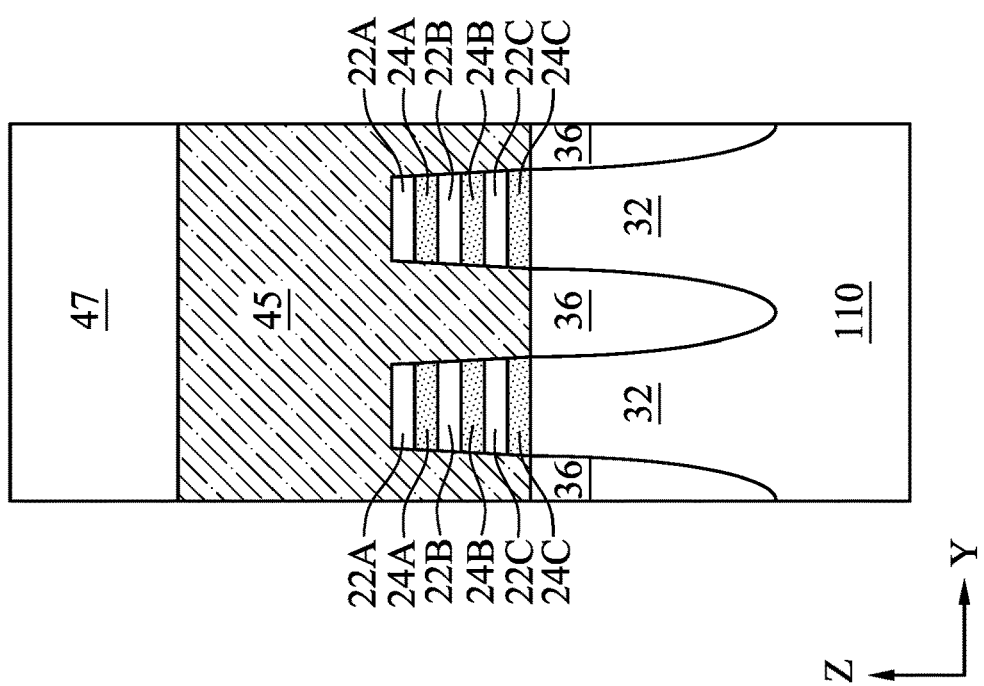

Next, an inner spacer layer is formed to fill the recesses 64 in the nanostructures 24 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses 64 in the nanostructures 24) form the inner spacers 74. The resulting structure is shown in FIGS. 7A-7C.

Figure 8A:
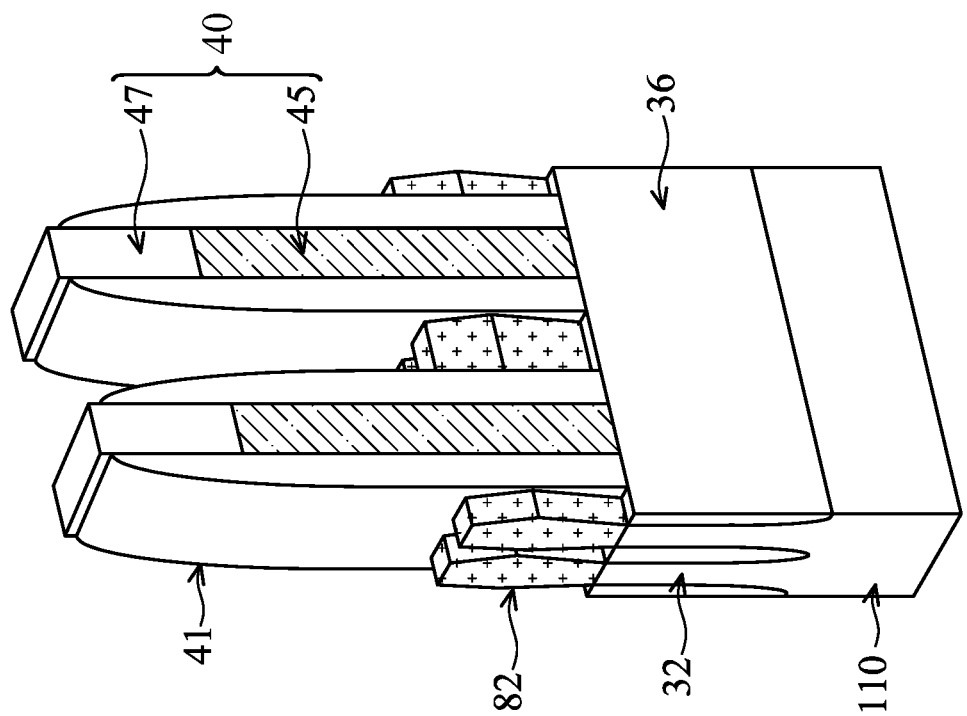
Figure 8C:
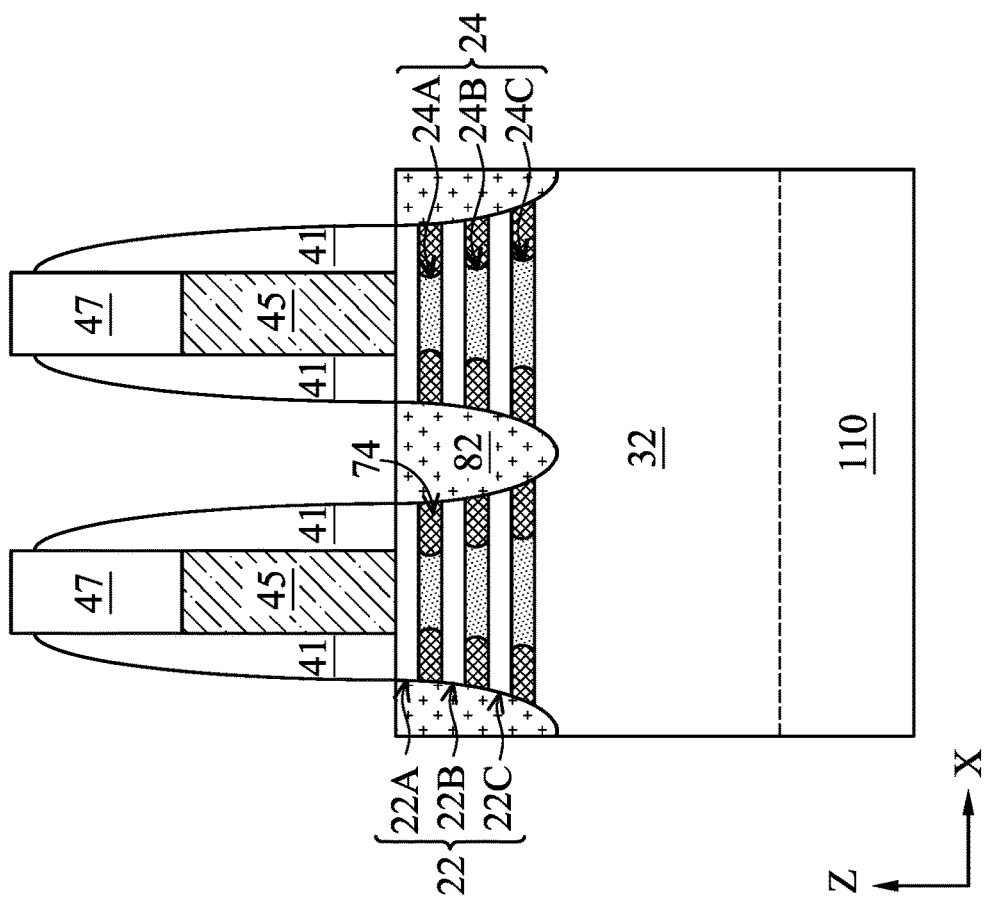
Figure 8B:
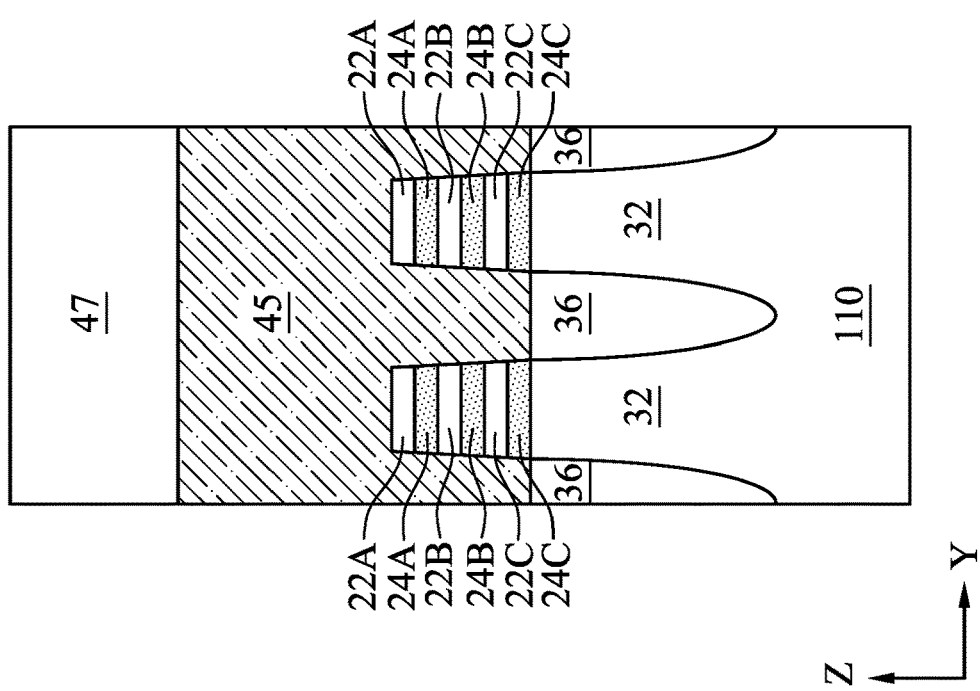

FIGS. 8A-8C illustrate formation of source/drain regions 82 corresponding to act 1400 of FIG. 16. Source/drain region(s) may refer to a source or a drain, individually or collectively dependent upon the context. In the illustrated embodiment, the source/drain regions 82 are epitaxially grown from epitaxial material(s). In some embodiments, the source/drain regions 82 exert stress in the respective channels 22A-22C, thereby improving performance. The source/drain regions 82 are formed such that each dummy gate structure 40 is disposed between respective neighboring pairs of the source/drain regions 82. In some embodiments, the spacer layer 41 separates the source/drain regions 82 from the dummy gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 32.

The source/drain regions 82 may be implanted with dopants followed by an anneal. The source/drain regions may have an impurity concentration of between about $10^{19}$ cm$^{-3}$ and about $10^{21}$ cm$^{-3}$. N-type and/or p-type impurities for source/drain regions 82 may be any of the impurities previously discussed. In some embodiments, the source/drain regions 82 are in situ doped during growth. A contact etch stop layer (CESL) and interlayer dielectric (ILD), not illustrated for simplicity in FIGS. 8A-8C, may then be formed covering the dummy gate structures 40 and the source/drain regions 82.

Figure 9A:
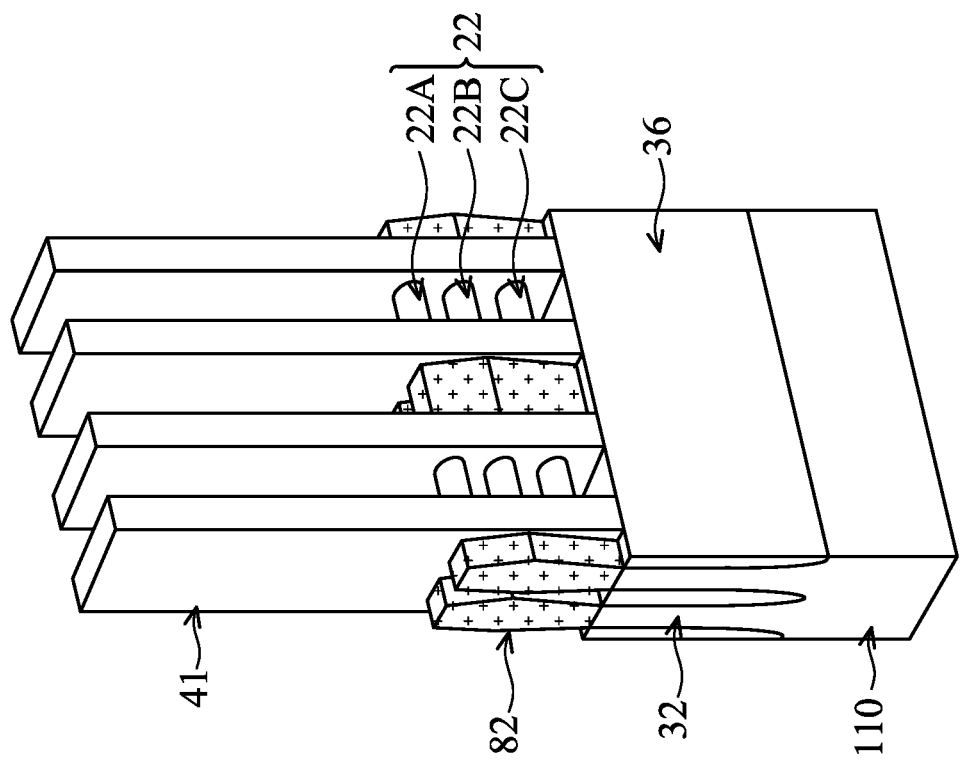

In FIGS. 9A-9C fin channels 22A-22C are released by removal of the nanostructures 24A-24C, the mask layer 47, and the dummy gate layer 45, which corresponds to act 1500 of FIG. 16. A planarization process, such as a CMP, is performed to level the top surfaces of the dummy gate layer 45 and gate spacer layer 41. The planarization process may also remove the mask layer 47 (see FIG. 8A) on the dummy gate layer 45, and portions of the gate spacer layer 41 along sidewalls of the mask layer 47. Accordingly, the top surfaces of the dummy gate layer 45 are exposed.

Next, the dummy gate layer 45 is removed in an etching process, so that recesses 92 are formed. In some embodiments, the dummy gate layer 45 is removed by an anisotropic dry etch process. For example, the etching process may include a dry etch process using reaction gas(es) that selectively etch the dummy gate layer 45 without etching the spacer layer 41. The dummy gate dielectric, when present, may be used as an etch stop layer when the dummy gate layer 45 is etched. The dummy gate dielectric may then be removed after the removal of the dummy gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110) and are stacked vertically. The nanosheets may be collectively referred to as the channels 22 of a nanostructure device, such as a nanosheet FET (NSFET). During removal of the nanostructures 24, the ESD protection device region 100R is protected, for example, by a mask including photoresist, such that the second semiconductor layers 23 remain following removal of the nanostructures 24.

In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises F2 and HF, and the carrier gas may be an inert gas such as Ar, He, N2, combinations thereof, or the like.

In some embodiments, the nanostructures 24 are removed and the nanostructures 22 are patterned to form channel regions of both PFETs and NFETs. However, in some embodiments the nanostructures 24 may be removed and the nanostructures 22 may be patterned to form channel regions of a first nanostructure device, and nanostructures 22 may be removed and the nanostructures 24 may be patterned to form channel regions of a second nanostructure device. In some embodiments, the nanostructures 22 may be removed and the nanostructures 24 may be patterned to form channel regions of a first nanostructure device, and the nanostructures 24 may be removed and the nanostructures 22 may be patterned to form channel regions of a second nanostructure device. In some embodiments, the nanostructures 22 may be removed and the nanostructures 24 may be patterned to form channel regions of both PFETs and NFETs.

In some embodiments, the nanosheets 22 of the nanostructure devices are reshaped (e.g. thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

Figure 10A:
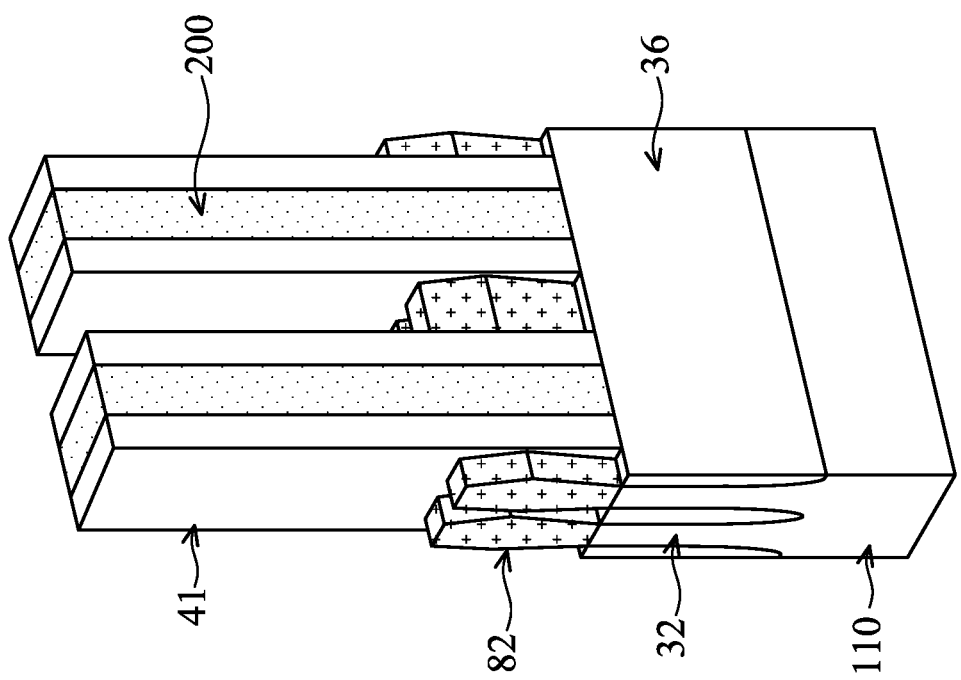
Figure 10C:
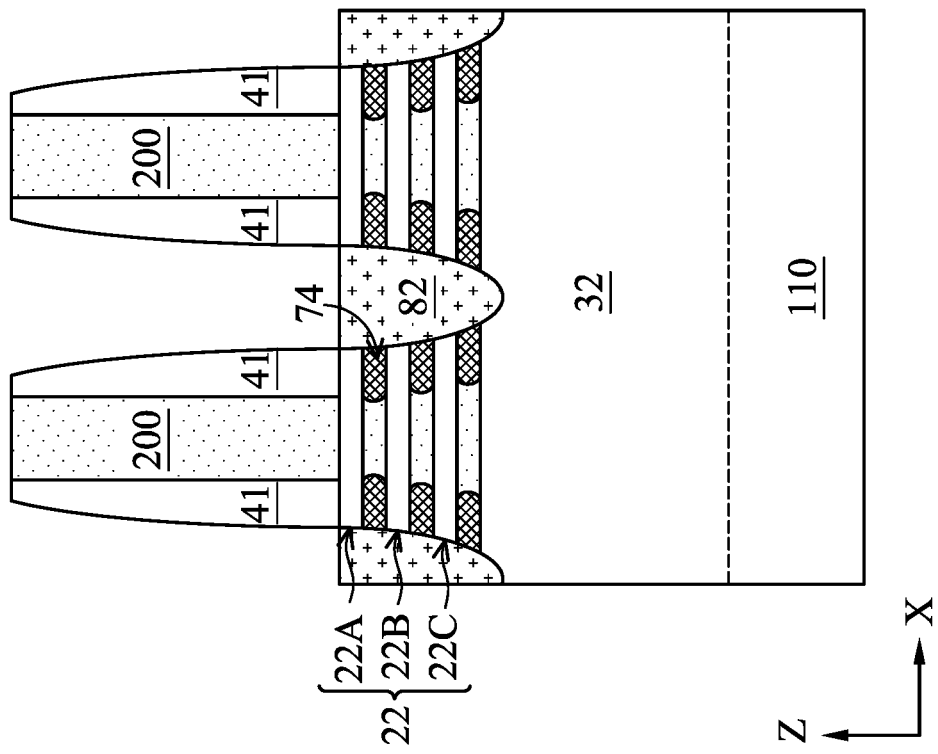
Figure 10B:
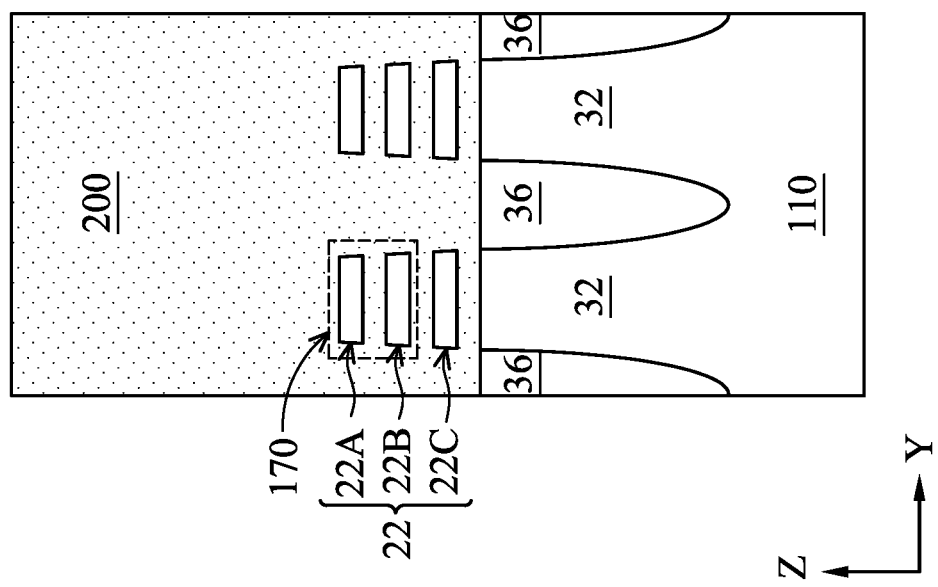

Next, in FIGS. 10A-10C, replacement gates 200, such as the gate structure 200, are formed, corresponding to act 1600 of FIG. 16. Each replacement gate 200 generally includes an interfacial layer (IL) 210, a gate dielectric layer 600 and a gate fill layer 290. In some embodiments, the replacement gate 200 further includes work function metal layers. Formation of the gate structures 200 is described in greater detail with reference to FIG. 12.

Figure 11A:
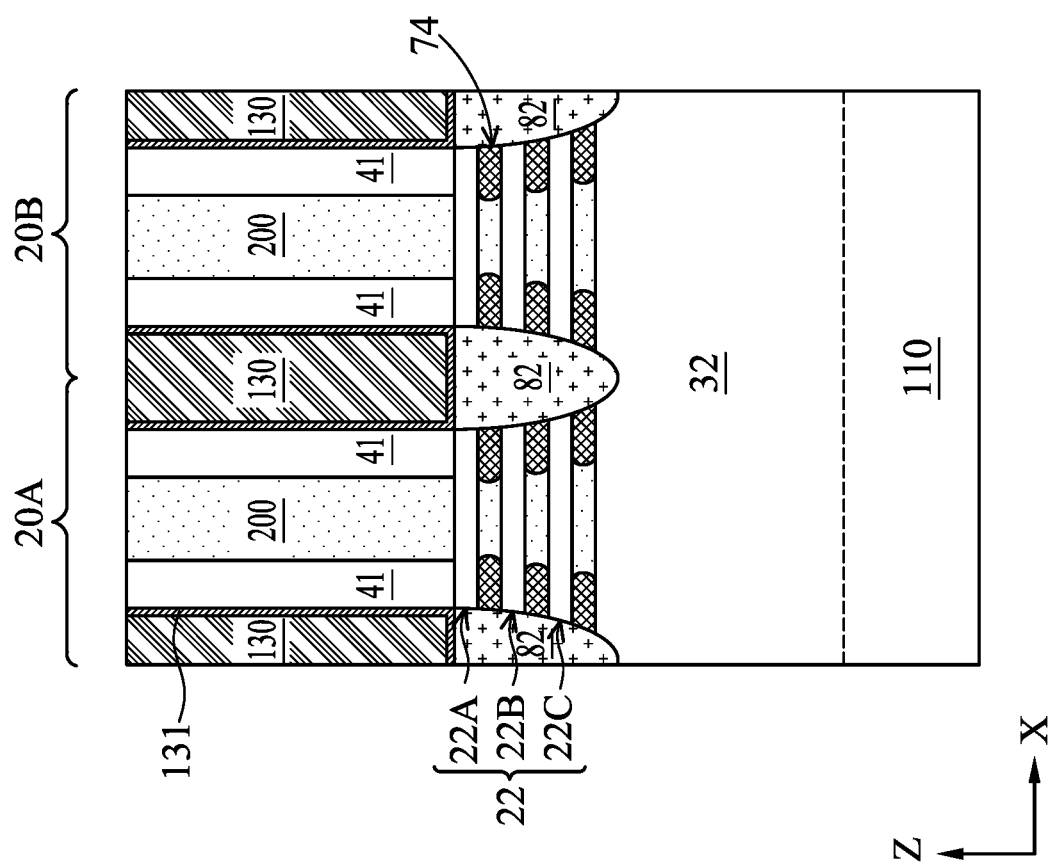

FIG. 11A shows the semiconductor device including an interlayer dielectric (ILD) 130 and an etch stop layer (ESL) 131. The ILD 130 provides electrical isolation between the various components of the semiconductor device discussed above, for example between the gate structure 200 and a subsequently formed source/drain contact. The etch stop layer 131 may be formed prior to forming the ILD 130, and may be positioned laterally between the ILD 130 and the gate spacers 41 and vertically between the ILD 130 and the source/drain features 82. In some embodiments, insulating materials that form the ILD 130 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric material used to form the ILD 130 may be deposited using any suitable method, such as CVD, physical vapor deposition (PVD), ALD, PEALD, PECVD, SACVD, FCVD, spin-on, and/or the like, or a combination thereof. In some embodiments, the etch stop layer 131 is or includes a dielectric material, such as SiN, SiCN, SiC, SiOC, SiOCN, HfO2, ZrO2, ZrAlOx, HfAlOx, HfSiOx, Al2O3, or other suitable material. The dielectric material used to form the ESL 131 may be deposited using any suitable method, such as CVD, PVD, ALD, PEALD, PECVD, SACVD, FCVD, spin-on, and/or the like, or a combination thereof. In some embodiments, thickness of the etch stop layer 131 is in a range of about 1 nm to about 5 nm.

Figure 11B:
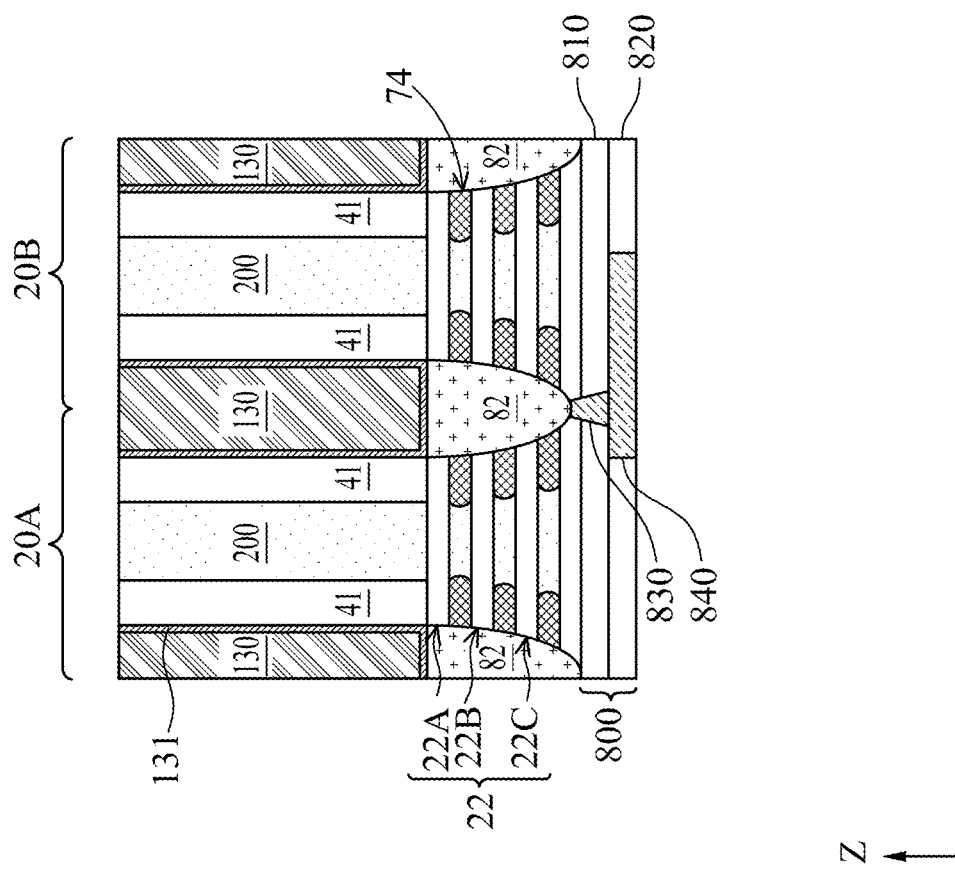

FIG. 11B shows the semiconductor device including backside interconnect structure 800 in accordance with various embodiments. Frontside interconnect features are omitted from view in FIG. 11B for clarity of illustration. In some embodiments, following formation of frontside interconnect features, which corresponds to act 1700 of FIG. 16, the substrate 110 is thinned or removed, and the fins 32 are thinned or removed. Following thinning of the substrate 110, and optionally the fins 32, the backside interconnect structure 800 is formed, corresponding to act 1800 of FIG. 16. A first backside ILD 810 may be formed on the backside of the semiconductor device. Materials and formation processes may be similar to those described with reference to the ILD 130. Then, a first removal operation, such as an etching operation, may be performed to pattern the first backside ILD 810 and optionally the fins 32 to form first openings that expose one or more of the source/drain regions 82. A first backside via or contact 830 is formed in one of the openings, and contacts the backside of the source/drain region 82. In some embodiments, a silicide is formed between the first backside contact 830 and the source/drain region 82. A second backside ILD 820 is formed on the first backside ILD 810. Materials and formation processes may be similar to those described with reference to the ILD 130. Second openings are formed in the second backside ILD 820 by a second removal process, such as a second etching operation, that patterns the second backside ILD 820. A first backside trace or wire 840 is formed in the second opening. Formation of the first backside contact 830 may be similar in many respects to formation of the contacts 120.

Figure 12:
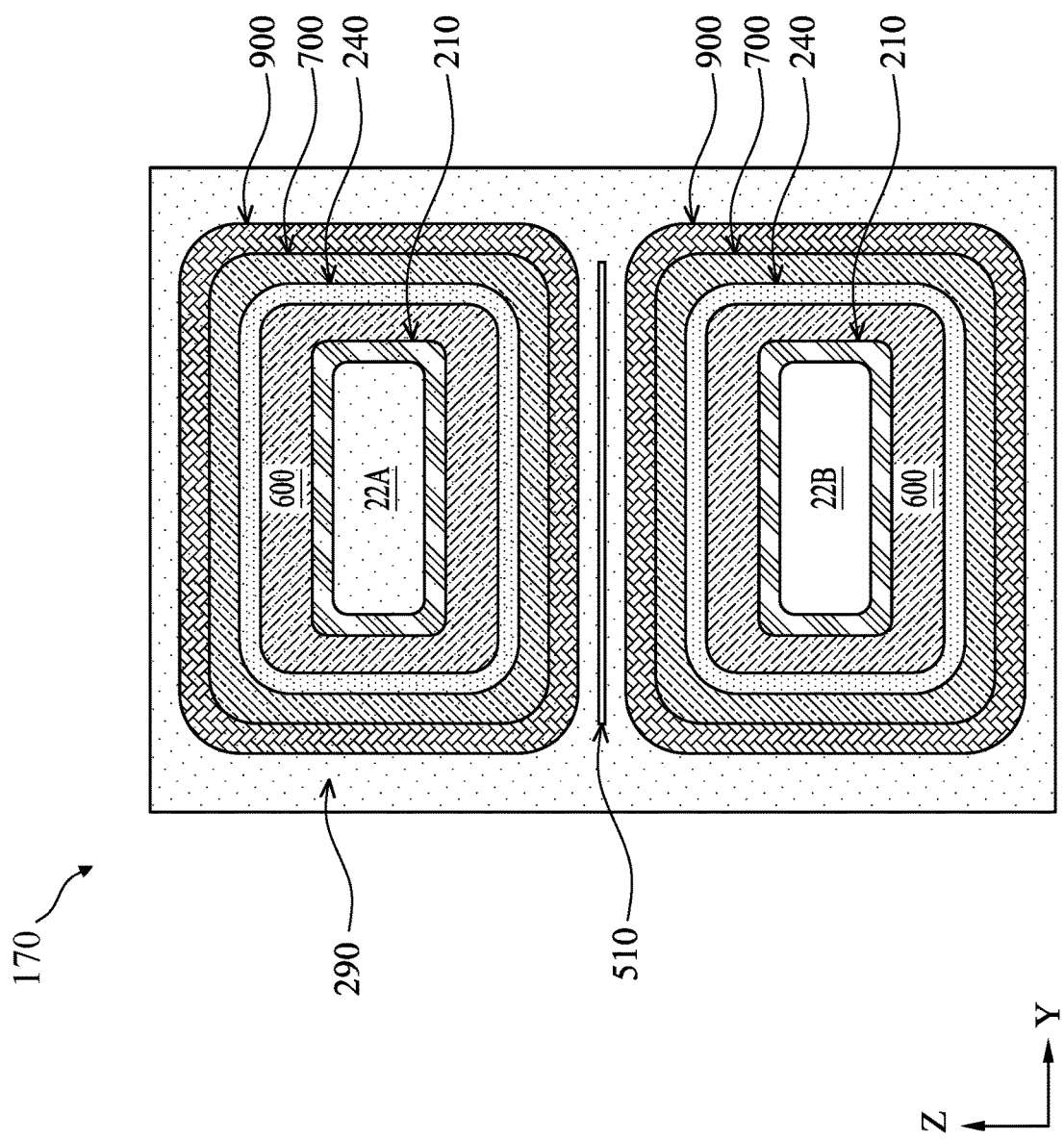

FIG. 12 is a cross-sectional side view of a region 170 of FIG. 10B in accordance with various embodiments. The gate structure 200 is disposed over and between the channels 22A-22C, respectively. In some embodiments, the gate structure 200 is disposed over and between the channels 22A-22C, which are silicon channels for N-type devices or silicon germanium channels for P-type devices. In some embodiments, the gate structure 200 includes the interfacial layer (IL) 210, one or more gate dielectric layers 600, one or more work function tuning layers 900, and a metal fill layer 290.

The interfacial layer 210, which may be an oxide of the material of the channels 22A-22C, is formed on exposed areas of the channels 22A-22C and the top surface of the fin 32. The interfacial layer 210 promotes adhesion of the gate dielectric layers 600 to the channels 22A-22C. In some embodiments, the interfacial layer 210 has thickness of about 5 Angstroms (A) to about 50 Angstroms (A). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance as described above. In some embodiments, the interfacial layer 210 is doped with a dipole, such as lanthanum, for threshold voltage tuning.

The gate dielectric layer 600 may be formed on the IL 210. In some embodiments, the gate dielectric layer 600 includes at least one high-k gate dielectric material, which may refer to dielectric materials having a high dielectric constant that is greater than a dielectric constant of silicon oxide (k≈3.9). Exemplary high-k dielectric materials include HfO2, HfSiO, HfSiON, HfTaO, HfTiO, HfZrO, ZrO2, Ta2O5, or combinations thereof. In some embodiments, the gate dielectric layer 600 has thickness of about 5 Å to about 100 A.

In some embodiments, the gate dielectric layer 600 may include dopants, such as metal ions driven into the high-k gate dielectric from La2O3, MgO, Y2O3, TiO2, Al2O3, Nb2O5, or the like, or boron ions driven in from B2O3, at a concentration to achieve threshold voltage tuning. As one example, for N-type transistor devices, lanthanum ions in higher concentration reduce the threshold voltage relative to layers with lower concentration or devoid of lanthanum ions, while the reverse is true for P-type devices. In some embodiments, the gate dielectric layer 600 of certain transistor devices (e.g., IO transistors) is devoid of the dopant that is present in certain other transistor devices (e.g., N-type core logic transistors or P-type IO transistors). In N-type IO transistors, for example, relatively high threshold voltage is desirable, such that it may be preferable for the IO transistor high-k dielectric layers to be free of lanthanum ions, which would otherwise reduce the threshold voltage.

In some embodiments, the gate structure 200 further includes one or more work function metal layers, represented collectively as work function metal layer 900. When configured as an NFET, the work function metal layer 900 of the GAA device 20 may include at least an N-type work function metal layer, an in-situ capping layer, and an oxygen blocking layer. In some embodiments, the N-type work function metal layer is or comprises an N-type metal material, such as TiAlC, TiAl, TaAlC, TaAl, or the like. The in-situ capping layer is formed on the N-type work function metal layer, and may comprise TiN, TiSiN, TaN, or another suitable material. The oxygen blocking layer is formed on the in-situ capping layer to prevent oxygen diffusion into the N-type work function metal layer, which would cause an undesirable shift in the threshold voltage. The oxygen blocking layer may be formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the work function metal layer 900 includes more or fewer layers than those described.

The work function metal layer 900 may further include one or more barrier layers comprising a metal nitride, such as TiN, WN, MON, TaN, or the like. Each of the one or more barrier layers may have thickness ranging from about 5 A to about 20 A. Inclusion of the one or more barrier layers provides additional threshold voltage tuning flexibility. In general, each additional barrier layer increases the threshold voltage. As such, for an NFET, a higher threshold voltage device (e.g., an IO transistor device) may have at least one or more than two additional barrier layers, whereas a lower threshold voltage device (e.g., a core logic transistor device) may have few or no additional barrier layers. For a PFET, a higher threshold voltage device (e.g., an IO transistor device) may have few or no additional barrier layers, whereas a lower threshold voltage device (e.g., a core logic transistor device) may have at least one or more than two additional barrier layers. In the immediately preceding discussion, threshold voltage is described in terms of magnitude. As an example, an NFET IO transistor and a PFET IO transistor may have similar threshold voltage in terms of magnitude, but opposite polarity, such as +1 Volt for the NFET IO transistor and −1 Volt for the PFET IO transistor. As such, because each additional barrier layer increases threshold voltage in absolute terms (e.g., +0.1 Volts/layer), such an increase confers an increase to NFET transistor threshold voltage (magnitude) and a decrease to PFET transistor threshold voltage (magnitude).

The gate structure 200 also includes metal fill layer 290. The metal fill layer 290 may include a conductive material such as tungsten, cobalt, ruthenium, iridium, molybdenum, copper, aluminum, or combinations thereof. Between the channels 22A-22C, the metal fill layer 290 is circumferentially surrounded (in the cross-sectional view) by the one or more work function metal layers 900, which are then circumferentially surrounded by the gate dielectric layers 600, which are circumferentially surrounded by the interfacial layer 210. The gate structure 200 may also include a glue layer that is formed between the one or more work function layers 900 and the metal fill layer 290 to increase adhesion. The glue layer is not specifically illustrated in FIG. 12 for simplicity. In some embodiments, a conductive layer is formed over the gate structure 200, and is in contact with the metal fill layer 290, the one or more work function layers 900 and the gate dielectric layers 600. The conductive layer may include fluorine-free tungsten (FFW) or another suitable material. In some embodiments, a dielectric capping layer is present over the conductive layer.

Additional processing may be performed following fabrication of the semiconductor device. For example, gate contacts may be formed that electrically couple to the gate structure 200, and source/drain contacts may be formed that electrically couple to the source/drain regions 82. Additional contacts (or "implant contacts") may be formed that electrically couple to the implant regions 160, 162. An interconnect structure may then be formed over the source/drain contacts, the gate contacts and the implant contacts. The interconnect structure may include a plurality of interconnect layers, each of which may include one or more dielectric layers with metallic features embedded therein, such as conductive traces and conductive vias, which form electrical connection between devices of the IC chip 10. In some embodiments, a conductive layer or conductive cap is present over the gate structure 200. In some embodiments, dielectric capping layers are present over the gate structure 200 and/or over the source/drain contacts. Configurations in which the dielectric capping layers are only present over the gate structure 200 (e.g., no second capping layers are present over the source/drain contacts) may be referred to as "single SAC" structures, and configurations in which the capping layers are present over gate structures 200 and source/drain contacts may be referred to as "double SAC" structures.

Figure 13:
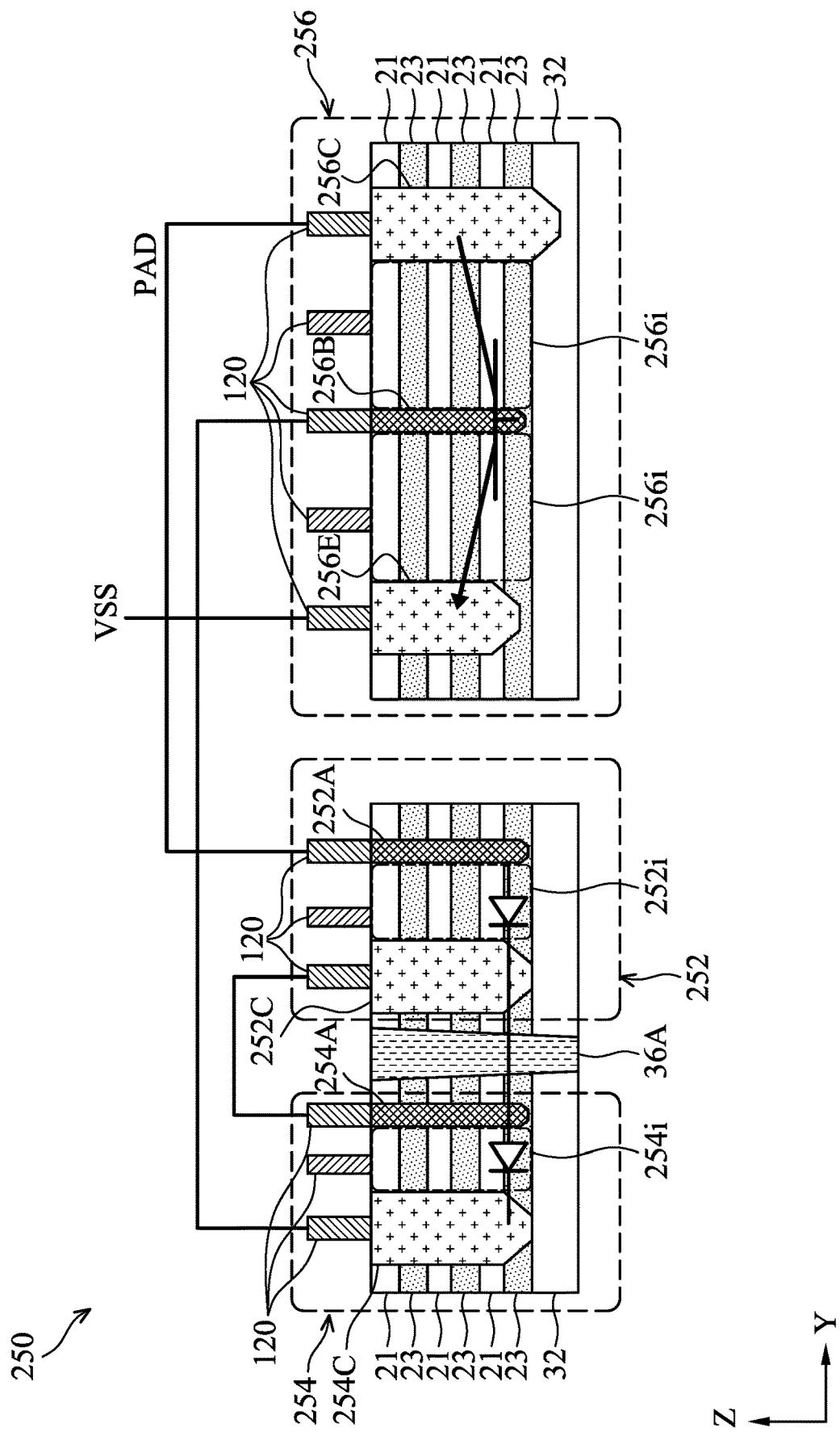
FIGS. 13-15 are diagrammatic cross-sectional side views of a portion of an IC device in accordance with various embodiments.
Figure 14:
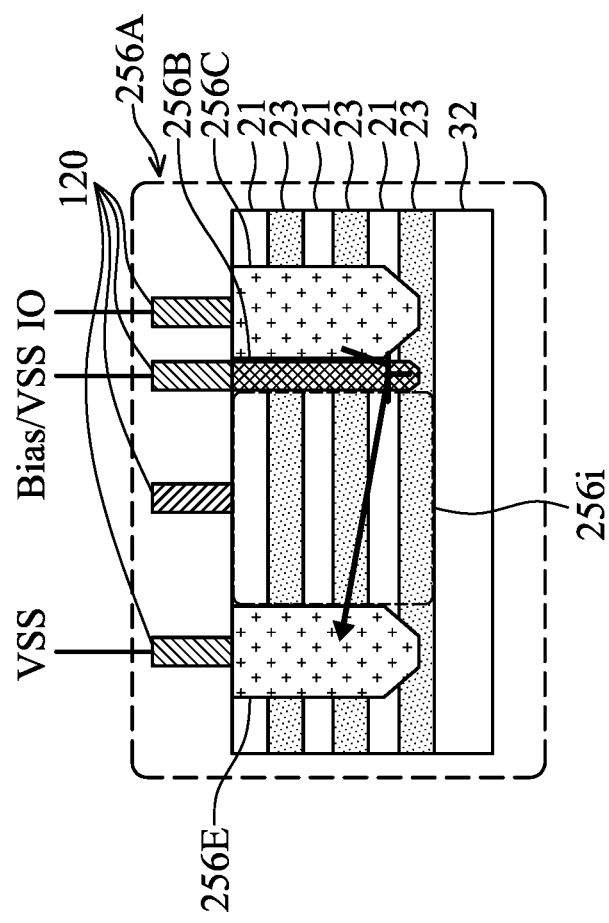
Figure 15:
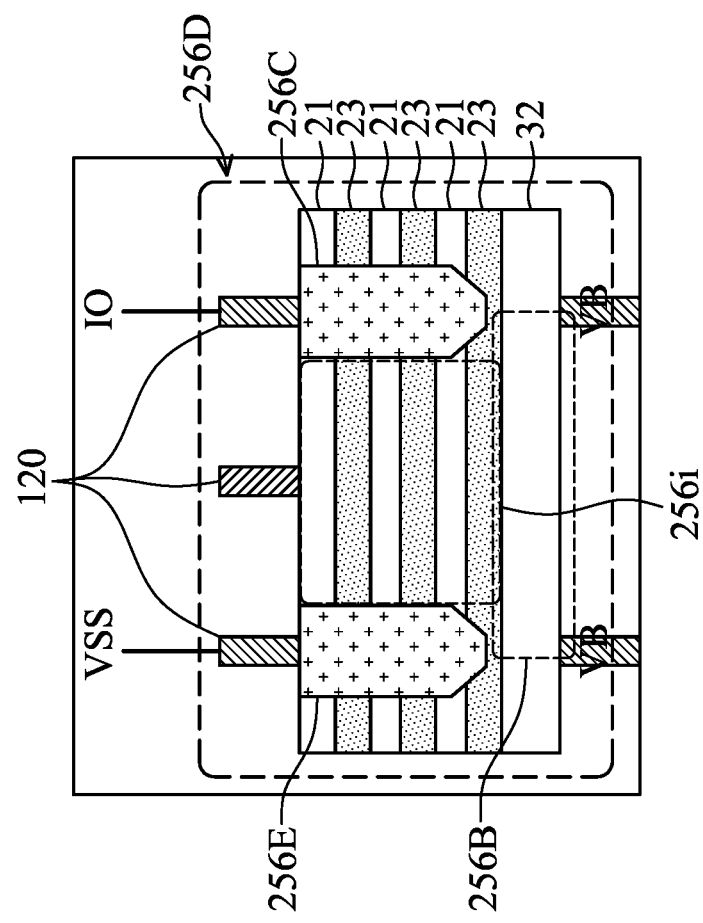

FIGS. 13-15 are cross-sectional side views illustrating ESD protection circuits 250 in accordance with various embodiments. FIG. 13 is a side view of the ESD protection circuit 250 including a bipolar junction device 256. FIG. 14 is a side view of a bipolar junction device 256A in accordance with other embodiments. FIG. 15 is a side view of an NiN device 256D in accordance with yet other embodiments.

In FIG. 13, the ESD protection circuit 250 includes the bipolar junction device 256 and PIN diodes 252, 254 electrically connected thereto. The bipolar junction device 256 shown in FIG. 13 may be an NiPiN or PiNiP intrinsic bipolar junction transistor (iBJT), and may be referred to as the iBJT 256. The iBJT 256 includes a collector implant region 256C and an emitter implant region 256E that are separated by a base implant region 256B. The base implant region 256B is separated on either side from the respective collector or emitter implant region 256C, 256E by an intrinsic region 256i. Each intrinsic region 256i may be substantially free of doping impurities. In some embodiments, the intrinsic regions 256i may be very lightly doped with one or more doping impurities. In some embodiments, the collector and emitter implant regions 256C, 256E are N-type implant regions, and the base implant region 256B is a P-type implant region, which may be the same or similar to the implant regions 160, 162 shown in FIGS. 2C and 3C. In some embodiments, the collector and emitter implant regions 256C, 256E are P-type implant regions, and the base implant region 256B is an N-type implant region. Widths of each of the base, emitter and collector implant regions 256B, 256E, 256C may be different from each other or the same as each other. For example, as shown in FIG. 13, the collector and emitter implant regions 256C, 256E may be wider than the base implant region 256B. In some embodiments, the collector and emitter implant regions 256C, 256E are substantially the same width as each other. Concentrations of impurities may be substantially the same in each of the implant regions 256B, 256C, 256E, or one or more of the implant regions 256B, 256C, 256E may have greater or lower concentration than another or others of the implant regions 256B, 256C, 256E.

The PIN diodes 252, 254 each include respective first implant regions 252A, 254A and respective second implant regions 252C, 254C. The first implant regions 252A, 254A may be referred to as anode implant regions, and the second implant regions 252C, 254C may be referred to as cathode implant regions. The PIN diodes 252, 254 are separated from each other by the second isolation region 36A, as shown. Each of the anode implant regions 252A, 254A is separated from the respective cathode implant region 252C, 254C by a respective intrinsic region 252i, 254i, which may be similar to the intrinsic regions 256i described with reference to the bipolar junction device 256. The implant regions 252C, 254A may be separated from the second isolation region 36A by intrinsic regions, which are shown but not specifically labeled for clarity of illustration. In some embodiments, the anode implant regions 252A, 254A are P-type implant regions, and the cathode implant regions 252C, 254C are N-type implant regions.

The IC chip 10 may further include contacts 120 that are formed over the source/drain features 82 in the internal circuitry device region 150R and over the implant regions 256B, 256C, 256E, 252A, 252C, 254A, 254C and intrinsic regions 256i, 252i, 254i in the ESD protection device region 100R. The contacts 120 may include a conductive material such as tungsten, ruthenium, cobalt, copper, titanium, titanium nitride, tantalum, tantalum nitride, iridium, molybdenum, nickel, aluminum, or combinations thereof. The contacts 120 may be surrounded by barrier layers (not shown), such as SiN or TiN, which help prevent or reduce diffusion of materials from and into the contacts 120. A silicide layer may also be formed between the source/drain features 82 and the contacts 120, so as to reduce source/drain contact resistance. The silicide layer includes nickel, cobalt, titanium, tantalum, platinum, tungsten, other noble metals, other refractory metals, rare earth metals or their alloys. In some embodiments, thickness of the silicide layer (in the Z direction) is in a range of about 0.5 nm to about 5 nm. In some embodiments, height of the contacts 120 may be in a range of about 1 nm to about 50 nm.

Electrical interconnection between the illustrated elements of the ESD protection circuit 250 is shown in FIG. 13. The collector implant region 256C and the anode implant region 252A may be electrically connected to each other and to one of the input pad 111 or the output pad 112. The base implant region 256B is electrically connected to the cathode implant region of the PIN diode 254. The emitter implant region 256E is electrically connected to the VSS pad 114 (or the VDD pad 113). The cathode implant region 252C is electrically connected to the anode implant region 254A.

In some embodiments, the implant regions 256B, 256C, 256E, 252A, 252C, 254A, 254C may extend to substantially the same depth (see FIG. 2C, for example). In some embodiments, one or more of the implant regions 256B, 256C, 256E, 252A, 252C, 254A, 254C extends to a different depth than others of the implant regions 256B, 256C, 256E, 252A, 252C, 254A, 254C. For example, as shown in FIG. 13, the collector implant region 256C extends to a deeper depth than others of the implant regions 256B, 256C, 256E, 252A, 252C, 254A, 254C. For example, the base and collector implant regions 256B, 256C may extend to a depth that is shallower than that of the implant regions 252A, 252C, 254A, 254C of the PIN diodes 252, 254. In some embodiments, the collector implant region 256C extends partially into the fin 32. In some embodiments, the implant regions 256B, 256C, 256E, 252A, 252C, 254A, 254C each extend partially through the bottommost second semiconductor layer 23. Positioning the implant regions 256B, 256C, 256E, 252A, 252C, 254A, 254C deeper than the bottommost region of nanosheet structures 21, 23 is beneficial for carriers to move mostly through SiGe when the iBJT 256 turns on.

During an ESD event, electrical voltage at the pad 111 or 112 may exceed the threshold voltage Vt1 of the bipolar junction device 256, causing the bipolar junction device 256 to snap back and conduct electrical current to the VSS pad 114 or the VDD pad 113. No bulk is needed for the iBJT 256, and SiGe may be formed instead of nanosheet channels, as shown in FIG. 13. Both Si layers 21 and SiGe layers 23 conduct electrons, providing a discharging path. P+ implants when used as the base implant region 256B can be applied a bias voltage or connected to a trigger circuit. The diode string including the PIN diodes 252, 254 turns on when the ESD event occurs, and uniformly raises potential at the base implant region 256B to trigger the iBJT 256. Generally, greater current is conducted through the SiGe layers 23 than the Si layers 21 during the ESD event. It may be advantageous for the implant regions 256B, 256C, 256E of the iBJT 256 to extend through the lowermost SiGe layer 23 to increase discharging speed through the iBJT 256.

In FIG. 14, a bipolar junction device 256A is illustrated that includes an NiPN or PiNP arrangement of the implant regions 256B, 256C, 256E, which may be referred to as the NPiN snapback device 256A or the PNiP snapback device 256A. As shown, the intrinsic region 256i between the base implant region 256B and the collector implant region 256C may be omitted. Namely, the base implant region 256B may directly abut the collector implant region 256C with substantially no intrinsic silicon or silicon germanium therebetween. Removal of the intrinsic region 256i near the collector implant region 256C as shown in FIG. 14 may further reduce trigger voltage Vt1 in the NPiN snapback device 256A.

In FIG. 15, a bipolar junction device 256D is illustrated that includes an NiN or PiP arrangement of the implant regions 256C, 256E with the implant region 256B omitted, which may be referred to as the NiN snapback device 256D or the PiP snapback device 256D. In the NiN arrangement, the NiN snapback device 256D omits the P+ base implant region 256B, which is advantageous to increase beta gain. Contacts 120 on the backside of the fin 32 carry a base voltage VB that acts as a base bias voltage to reduce trigger voltage Vt1.

Embodiments may provide advantages. The iBJT 256, 256A, 256D and PIN diode string 252, 254 are compatible with processes that include backside interconnect structure 800 and omit backside interconnect structure 800. The intrinsic regions 256i of the snapback devices 256, 256A, 256D reduces leakage. When used in conjunction with the backside interconnect structure 800, the thin bulk of the snapback devices 256, 256A, 256D improves frontside and backside metal routing flexibility and also improves performance, power and area. Array size of the iBJT 256, 256A, 256D is scalable for on resistance Ron improvement.

In accordance with at least one embodiment, a device includes a first circuit region including a nanostructure device and a second circuit region offset from the first circuit region. The nanostructure device has a vertical stack of nanostructures disposed in a plurality of first semiconductor layers and a gate structure wrapping around the nanostructures of the vertical stack. The second circuit region includes a bipolar junction device electrically connected to the nanostructure device and at least one diode electrically connected between a collector and a base of the bipolar junction device. At least one implant region extends through the plurality of first semiconductor layers and a plurality of second semiconductor layers that are disposed between respective vertically neighboring pairs of the plurality of first semiconductor layers. A backside interconnect structure is electrically connected to a source/drain region of the nanostructure device.

In accordance with at least one embodiment, a device includes: an input pad; an output pad; a first power pad; circuitry in data communication with the input pad and the output pad and electrically connected to the first power pad, the circuitry including at least one nanostructure device having a vertical stack of semiconductor channels; an electrostatic discharge (ESD) protection circuit coupled between the first power pad and the input pad or the output pad, the ESD protection circuit including: a snapback device having at least two first implant regions that each extends through a multilayer lattice of alternating first semiconductor layers and second semiconductor layers, the first semiconductor layers being of a first type different than a second type of the second semiconductor layers; and at least one diode having at least two second implant regions that each extends through the multilayer lattice; and a backside interconnect structure in contact with a first nanostructure device of the at least one nanostructure device.

In accordance with at least one embodiment, a method includes: forming a multilayer structure of alternating first semiconductor layers and second semiconductor layers over a substrate; forming a plurality of implant regions of a snapback device in a first region of the multilayer structure; forming a vertical stack of nanosheets by patterning the multilayer structure in a second region of the multilayer structure offset from the first region; forming source/drain regions abutting the vertical stack; forming a gate structure wrapping around the nanosheets of the vertical stack; and forming respective contacts in contact with the plurality of implant regions and at least one of the source/drain regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a first circuit region including:
        a nanostructure device having:
            a vertical stack of nanostructures disposed in a plurality of first semiconductor layers; and
            a gate structure wrapping around the nanostructures of the vertical stack;
        a second circuit region offset from the first circuit region, and including:
            a bipolar junction device electrically connected to the nanostructure device; and
            at least one diode electrically connected between a collector and a base of the bipolar junction device; and
        at least one implant region that extends through the plurality of first semiconductor layers and a plurality of second semiconductor layers that are disposed between respective vertically neighboring pairs of the plurality of first semiconductor layers;
        a backside interconnect structure electrically connected to a source/drain region of the nanostructure device.

2. The device of claim 1, further comprising:
    a first pad in data communication with the nanostructure device; and
    an electrostatic discharge (ESD) circuit electrically connected to the first pad, the ESD circuit including the bipolar junction device and the at least one diode.

3. The device of claim 1, wherein the bipolar junction device includes:
    a first implant region including first impurities of a first type;
    a second implant region including second impurities of a second type;
    a third implant region including third impurities of the second type; and
    a first intrinsic region between the first implant region and the second implant region.

4. The device of claim 3, wherein the bipolar junction device further includes:
    a second intrinsic region between the first implant region and the third implant region.

5. The device of claim 1, wherein the bipolar junction device includes:
    a second implant region including second impurities of a second type;
    a third implant region including third impurities of the second type; and
    an intrinsic region between the second implant region and the third implant region.

6. The device of claim 5, wherein a backside contact is in contact with the intrinsic region, the backside contact being biased with a base voltage in operation.

7. A device comprising:
    an input pad;
    an output pad;
    a first power pad;
    circuitry in data communication with the input pad and the output pad and electrically connected to the first power pad, the circuitry including at least one nanostructure device having a vertical stack of semiconductor channels;
    an electrostatic discharge (ESD) protection circuit coupled between the first power pad and the input pad or the output pad, the ESD protection circuit including:
        a snapback device having at least two first implant regions that each extends through a multilayer lattice of alternating first semiconductor layers and second semiconductor layers, the first semiconductor layers being of a first type different than a second type of the second semiconductor layers; and
        at least one diode having at least two second implant regions that each extends through the multilayer lattice;
    a backside interconnect structure in contact with a first nanostructure device of the at least one nanostructure device.

8. The device of claim 7, wherein the at least one diode includes a first diode and a second diode, and the device further comprises a first isolation region between the first diode and the second diode.

9. The device of claim 8, wherein the circuitry includes a second isolation region abutting the first nanostructure device.

10. The device of claim 9, wherein an upper surface of the second isolation region is at a level substantially the same as a level of a lower surface of a lowest second semiconductor layer of the second semiconductor layers, and an upper surface of the first isolation region is at a level coplanar with an upper surface of a topmost first semiconductor layer of the first semiconductor layers.

11. The device of claim 7, wherein the ESD protection circuit includes a plurality of ESD protection circuit regions, each including:
    a bipolar junction device having a collector implant region and an emitter implant region; and
    at least one PIN diode, each having a cathode implant region and an anode implant region.

12. The device of claim 11, wherein the at least one PIN diode includes a first PIN diode and a second PIN diode, the anode implant region of the first PIN diode is connected to the input pad or the output pad, the cathode implant region of the second PIN diode is connected to a base implant region of the bipolar junction device, and the cathode implant region of the first PIN diode is connected to the anode implant region of the second PIN diode.

13. The device of claim 7, wherein the first semiconductor layers are silicon, and the second semiconductor layers are silicon germanium.

14. A device, comprising:
    an input pad;
    an output pad;
    a first power pad;

a multilayer structure of alternating first semiconductor layers and second semiconductor layers, the multilayer structure including a first side and a second side opposite to the first side;

an electrostatic discharge (ESD) protection circuit in a first region of the multilayer stack, the ESD protection circuit including:
- a snapback device having at least two first implant regions that extend into the first side of the multilayer structure, the at least two first implant regions being of a first type; and
- at least one diode having at least two second implant regions that each extend into the first side of the multilayer stack, the at least two second implant regions being of a second type different from the first type;

circuitry in a second region of the multilayer stack offset from the first region, the circuitry in data communication with the input pad and the output pad and electrically connected to the first power pad, the circuitry including:
- a first nanostructure device having a first stack of semiconductor channels; and
- a second nanostructure device having a second stack of semiconductor channels, the second nanostructure device being offset from the first nanostructure device;

source/drain regions abutting the first stack of semiconductor channels and the second stack of semiconductor channels;

a first gate structure in electrical communication with the first nanostructure device, the first gate structure wraps around the first nanostructure device; and a second gate structure in electrical communication with the second nanostructure device, the second gate structure wraps around the second nanostructure device.

15. The device of claim 14, wherein the at least one diode includes a first diode and a second diode.

16. The device of claim 15, further comprising an isolation region between the first diode and the second diode.

17. The device of claim 14, wherein the ESD protection circuit includes a plurality of ESD protection circuit regions, and each respective ESD protection circuit region of the plurality of ESD protection circuit regions includes:
- a bipolar junction device having a collector implant region and an emitter implant region; and
- at least one PIN diode having a cathode implant region and an anode implant region.

18. The device of claim 17, wherein the at least one PIN diode includes a first PIN diode and a second PIN diode.

19. The device of claim 18, wherein the anode implant region of the first PIN diode is connected to at least one of the input pad or the output pad, the cathode implant region of the second PIN diode is connected to a base implant region of the bipolar junction device, and the cathode implant region of the first PIN diode is connected to the anode implant region of the second PIN diode.

20. The device of claim 14, wherein the first semiconductor layers are silicon, and the second semiconductor layers are silicon germanium.

* * * * *